(12) United States Patent
Hara et al.

(10) Patent No.: US 9,984,853 B2
(45) Date of Patent: May 29, 2018

(54) METHOD FOR GENERATING WRITING DATA

(71) Applicant: NuFlare Technology, Inc., Yokohama (JP)

(72) Inventors: Shigehiro Hara, Kawasaki (JP); Kenichi Yasui, Kawasaki (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days. days.

(21) Appl. No.: 14/944,718

(22) Filed: Nov. 18, 2015

(65) Prior Publication Data

US 2016/0155609 A1    Jun. 2, 2016

(30) Foreign Application Priority Data

Nov. 28, 2014  (JP) .................................. 2014-240856
Jul. 16, 2015   (JP) .................................. 2015-142257

(51) Int. Cl.
*H01J 37/302*    (2006.01)

(52) U.S. Cl.
CPC . *H01J 37/3026* (2013.01); *H01J 2237/31764* (2013.01); *H01J 2237/31774* (2013.01)

(58) Field of Classification Search
CPC ... H01J 2237/31762; H01J 2237/31764; H01J 37/3026
See application file for complete search history.

(56) References Cited

U.S. PATENT DOCUMENTS

| 4,820,928 A * | 4/1989 | Ooyama ................ B82Y 10/00 |
| | | 250/492.2 |
| 5,754,443 A * | 5/1998 | Manabe .............. H01J 37/3026 |
| | | 250/492.22 |
| 2007/0053242 A1* | 3/2007 | Kasahara ............... B82Y 10/00 |
| | | 369/13.01 |
| 2007/0187624 A1 | 8/2007 | Suzuki et al. |
| 2010/0055587 A1 | 3/2010 | Fujimura et al. |

(Continued)

FOREIGN PATENT DOCUMENTS

| CN | 101248505 A | 8/2008 |
| JP | 2005-79115 | 3/2005 |
| JP | 2007-220728 | 8/2007 |

(Continued)

OTHER PUBLICATIONS

Combined Taiwanese Office Action and Search Report dated Nov. 29, 2016 in Patent Application No. 104133873 (with English language translation).

(Continued)

*Primary Examiner* — Eliza Osenbaugh-Stewart
(74) *Attorney, Agent, or Firm* — Oblon, McClelland, Maier & Neustadt, L.L.P.

(57) ABSTRACT

A method for generating writing data to be input to a writing apparatus, which writes a figure pattern on a target object by using a charged particle beam, includes generating the writing data, based on a data format that sequentially defines figure information on a figure pattern, and dose information which is defined before or after the figure information and indicates one of a dose and a dose modulation rate for modulating a dose, for a position of each of corner points of the figure pattern.

10 Claims, 25 Drawing Sheets

(56) References Cited

U.S. PATENT DOCUMENTS

2010/0173235 A1    7/2010  Kato et al.
2012/0085940 A1*   4/2012  Matsumoto ............ B82Y 10/00
                                                          250/492.3

FOREIGN PATENT DOCUMENTS

| JP | 2010-161099    | 7/2010  |
|----|----------------|---------|
| JP | 2012-501476    | 1/2012  |
| JP | 2012-84659 A   | 4/2012  |
| TW | 201133540 A1   | 10/2011 |
| TW | 201346970 A    | 11/2013 |
| TW | 201441758 A    | 11/2014 |

OTHER PUBLICATIONS

Office Action dated Jan. 3, 2017 in Korean Patent Application No. 10-2015-0167530 (with English translation).
Office Action issued in Taiwanese Patent Application No. 104133873 dated Apr. 19, 2017 with English Translation.

* cited by examiner

| $code_{D0}$ | $d_{00}$ | $d_{10}$ | $d_{11}$ | $d_{01}$ |
|---|---|---|---|---|
| $code_{FIG}$ | | | | |
| $x_0$ | | $y_0$ | w | h |
FIG. 3A
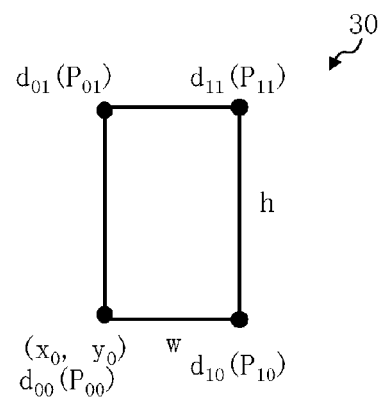
FIG. 3B
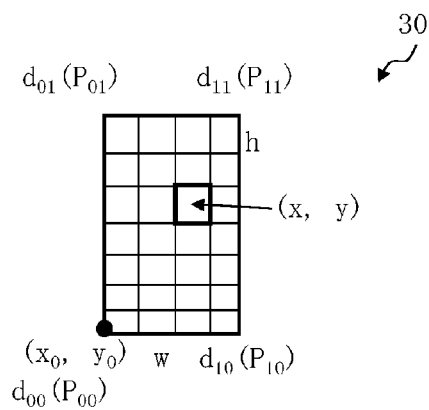
FIG. 3C

| code$_{DD}$ | ndiv$_x$ (=0) | ndiv$_y$ (=1) |
|---|---|---|
| y$_1$ | | |
| d$_{00}$ | d$_{10}$ | |
| d$_{01}$ | d$_{11}$ | |
| d$_{02}$ | d$_{12}$ | |
| code$_{FIG}$ | | |
| x$_0$ | y$_0$ | w | h |
FIG. 4A
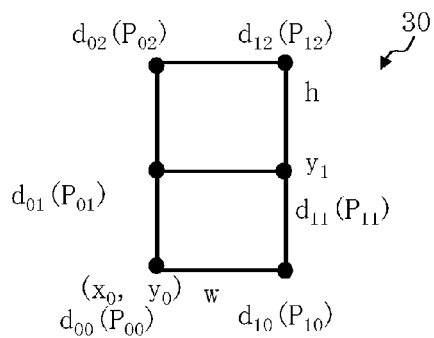
FIG. 4B
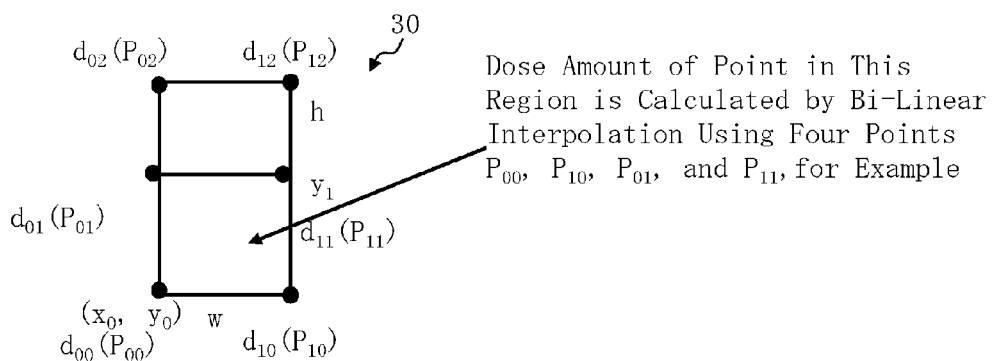
Dose Amount of Point in This Region is Calculated by Bi-Linear Interpolation Using Four Points P$_{00}$, P$_{10}$, P$_{01}$, and P$_{11}$, for Example
FIG. 4C

| code$_{DD}$ | ndiv$_x$ (=m) | ndiv$_y$ (=n) | | |
|---|---|---|---|---|
| x$_1$ | x$_2$ | x$_m$ | | |
| y$_1$ | y$_n$ | | | |
| d$_{00}$ | d$_{10}$ | d$_{20}$ | d$_{m0}$ | d$_{(m+1)0}$ |
| d$_{01}$ | d$_{11}$ | d$_{21}$ | d$_{m1}$ | d$_{(m+1)1}$ |
| d$_{0n}$ | d$_{1n}$ | d$_{2n}$ | d$_{mn}$ | d$_{(m+1)n}$ |
| d$_{0(n+1)}$ | d$_{1(n+1)}$ | d$_{2(n+1)}$ | d$_{m(n+1)}$ | d$_{(m+1)(n+1)}$ |
| code$_{FIG}$ | | | | |
| x$_0$ | y$_0$ | w | h | |

|  | Data Amount (Byte) According to This Embodiment |
|---|---|
| Dividing into Two in X and Y Directions | 60 |
| Dividing into Three in X and Y Directions | 84 |
| Dividing into Four in X and Y Directions | 112 |
| Dividing into Five in X and Y Directions | 144 |

| $code_{DD2}$ | $ndiv_x (=m)$ | $ndiv_y (=n)$ | | |
|---|---|---|---|---|
| $x_{off}$ | | $y_{off}$ | | |
| $w_m$ | | $h_m$ | | |
| $x_1$ | | $x_2$ | $x_m$ | |
| $y_1$ | | $y_n$ | | |
| $d_{00}$ | | $d_{10}$ | $d_{20}$ | $d_{m0}$ | $d_{(m+1)0}$ |
| $d_{01}$ | | $d_{11}$ | $d_{21}$ | $d_{m1}$ | $d_{(m+1)1}$ |
| $d_{0n}$ | | $d_{1n}$ | $d_{2n}$ | $d_{m0}$ | $d_{(m+1)n}$ |
| $d_{0(n+1)}$ | | $d_{1(n+1)}$ | $d_{2(n+1)}$ | $d_{m(n+1)}$ | $d_{(m+1)(n+1)}$ |
| $code_{NR}$ | $code_{FIG}$ | $N$ | | |
| $X_1$ | | $Y_1$ | $W_1$ | $H_1$ |
| ⋮ | | | | |
| $X_N$ | | $Y_N$ | $W_N$ | $H_N$ |

FIG. 12

FIG. 22A
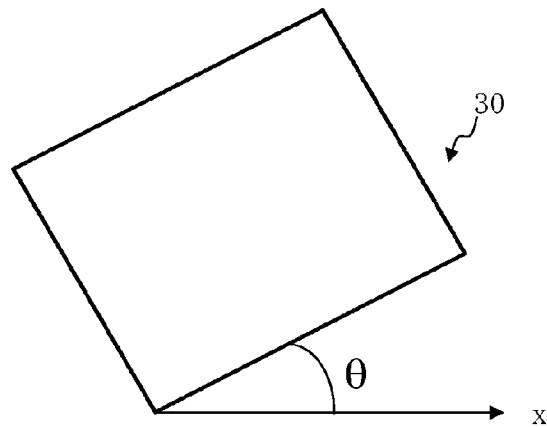
FIG. 22C
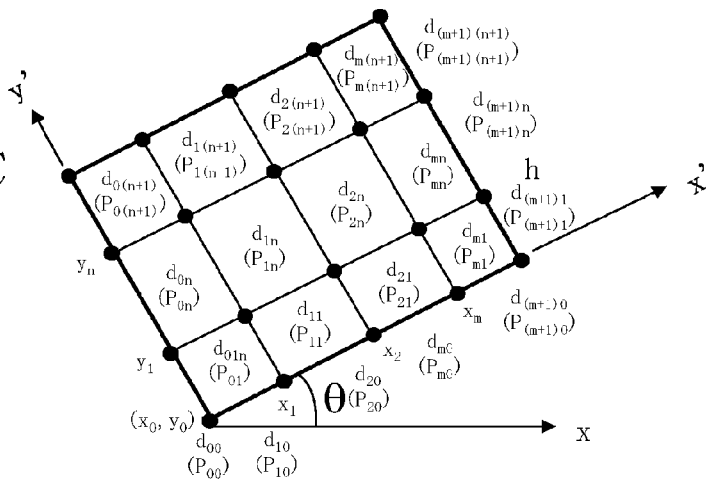
| code$_{ROT}$ | $\theta$ | | | |
|---|---|---|---|---|
| code$_{DD}$ | ndiv$_x$ (=m) | ndiv$_y$ (=n) | | |
| $x_1$ | $x_2$ | $x_m$ | | |
| $y_1$ | $y_n$ | | | |
| $d_{00}$ | $d_{10}$ | $d_{20}$ | $d_{m0}$ | $d_{(m+1)0}$ |
| $d_{01}$ | $d_{11}$ | $d_{21}$ | $d_{m1}$ | $d_{(m+1)1}$ |
| $d_{0n}$ | $d_{1n}$ | $d_{2n}$ | $d_{mn}$ | $d_{(m+1)n}$ |
| $d_{0(n+1)}$ | $d_{1(n+1)}$ | $d_{2(n+1)}$ | $d_{m(m+1)}$ | $d_{(m+1)(n+1)}$ |
| code$_{FIG}$ | | | | |
| $x_0$ | | $y_0$ | $w$ | $h$ |
FIG. 22B

| code$_{ROT}$ | $\theta$ | | | |
|---|---|---|---|---|
| code$_{DD2}$ | ndiv$_x$ (=m) | ndiv$_y$ (=n) | | |
| x$_{off}$ | y$_{off}$ | | | |
| w$_m$ | h$_m$ | | | |
| x$_1$ | x$_2$ | x$_m$ | | |
| y$_1$ | y$_n$ | | | |
| d$_{00}$ | d$_{10}$ | d$_{20}$ | d$_{m0}$ | d$_{(m+1)0}$ |
| d$_{01}$ | d$_{11}$ | d$_{21}$ | d$_{m1}$ | d$_{(m+1)1}$ |
| d$_{0n}$ | d$_{1n}$ | d$_{2n}$ | d$_{mn}$ | d$_{(m+1)n}$ |
| d$_{0(n+1)}$ | d$_{1(n+1)}$ | d$_{2(n+1)}$ | d$_{m(m+1)0}$ | d$_{(m+1)(n+1)}$ |
| code$_{NR}$ | code$_{FIG}$ | N | | |
| X$_1$ | Y$_1$ | W$_1$ | H$_1$ | |
| . | | | | |
| . | | | | |
| X$_N$ | Y$_N$ | W$_N$ | H$_N$ | |

| $code_{Cell\ Start}$ | | | | |
|---|---|---|---|---|
| $code_{DD2}$ | $ndiv_x(=m)$ | $ndiv_y(=n)$ | | |
| $x_{off}$ | $y_{off}$ | | | |
| $w_m$ | $h_m$ | | | |
| $x_1$ | $x_2$ | $x_m$ | | |
| $y_1$ | $y_n$ | | | |
| $d_{00}$ | $d_{10}$ | $d_{20}$ | $d_{m0}$ | $d_{(m+1)0}$ |
| $d_{01}$ | $d_{11}$ | $d_{21}$ | $d_{m1}$ | $d_{(m+1)1}$ |
| $d_{0n}$ | $d_{1n}$ | $d_{2n}$ | $d_{mn}$ | $d_{(m+1)n}$ |
| $d_{0(n+1)}$ | $d_{1(n+1)}$ | $d_{2(n+1)}$ | $d_{m(m+1)0}$ | $d_{(m+1)(n+1)}$ |
| $code_{FIG}$ | | | | |
| $X_1$ | $Y_1$ | $W_1$ | $H_1$ | |
| ⋮ | | | | |
| $code_{FIG}$ | | | | |
| $X_N$ | $Y_N$ | $W_N$ | $H_N$ | |
| $code_{Cell\ end}$ | | | | |

FIG. 27

METHOD FOR GENERATING WRITING DATA

CROSS-REFERENCE TO RELATED APPLICATION

This application is based upon and claims the benefit of priorities from the prior Japanese Patent Application No. 2014-240856 filed on Nov. 28, 2014 in Japan, and the prior Japanese Patent Application No. 2015-142257 filed on Jul. 16, 2015 in Japan, the entire contents of which are incorporated herein by reference.

BACKGROUND OF THE INVENTION

Field of the Invention

Embodiments of the present invention relate generally to a method for generating writing data, and more specifically, to a method for generating writing data to be input to the writing apparatus, for example.

Description of Related Art

In recent years, with high integration of LSI, the circuit line width (critical dimension) required for semiconductor devices is becoming progressively narrower. As a method for forming an exposure mask (also called a reticle) used to form circuit patterns on these semiconductor devices, the electron beam (EB) writing technique having excellent resolution is employed.

As an example employing the electron beam writing technique, the writing apparatus using multi-beams can be cited. Compared with the case of writing a pattern with a single electron beam, since in multi-beam writing it is possible to irradiate multiple beams at a time, the throughput can be greatly increased. For example, in a writing apparatus employing a multi-beam system, multi-beams are formed by letting portions of an electron beam emitted from an electron gun pass through a corresponding hole of a plurality of holes formed in the mask, blanking control is performed for each beam, and each unblocked beam is reduced by an optical system and deflected by a deflector so as to irradiate a desired position on a target object or "sample".

In the multi-beam writing apparatus, pattern data (writing data) converted from CAD data is input. Then, data conversion processing is performed on the input pattern data so as to advance to writing processing. In this process, it goes without saying that the amount of pattern data to be input to the writing apparatus is preferably small. Therefore, the pattern data defining a plurality of figure patterns is defined by data-compressed format (e.g., refer to Japanese Patent Application Laid-open (JP-A) No. 2005-079115).

In the writing apparatus, conventionally, correction processing of pattern size CD is performed with respect to dimensional variations resulting from a proximity effect that occurs by backscattering whose influence range is about 10 μm, a fogging effect whose influence range is on the order of mm, and a chromium loading effect whose influence range is on the order of mm. If needed to correct dimensional variation resulting from a phenomenon whose influence range is smaller than about 10 μm, it may be possible to define the amount of dose modulation for the figure pattern itself in the writing data to be input to the writing apparatus, for example. However, for correcting a small influence range such as described above, in the case of employing the above-described method, since the size of the figure pattern itself is too large, it is necessary to divide the figure pattern into a plurality of small figure patterns, and to define a dose modulation amount for each small figure pattern. Accordingly, there is a problem that the amount of the writing data will be excessively large.

BRIEF SUMMARY OF THE INVENTION

According to one aspect of the present invention, a method for generating writing data to be input to a writing apparatus that writes a figure pattern on a target object by using a charged particle beam, the method includes generating the writing data, based on a data format that sequentially defines figure information on a figure pattern, and dose information which is defined before or after the figure information and indicates one of a dose and a dose modulation rate for modulating a dose, for a position of each of corner points of the figure pattern.

According to another aspect of the present invention, a method for generating writing data to be input to a writing apparatus that writes at least one figure pattern on a target object by using a charged particle beam, the method includes inputting figure information on at least one figure pattern, and setting a quadrangular frame which encloses the at least one figure pattern, setting one of a dose and a dose modulation rate for modulating a dose, for a position of each of four corner points of the quadrangular frame, and generating the writing data, based on a data format that sequentially defines figure information on the at least one figure pattern, and dose information which is defined before or after the figure information and indicates the one of the dose and the dose modulation rate for the position of the each of the four corner points of the quadrangular frame.

According to yet another aspect of the present invention, a method for generating writing data to be input to a writing apparatus that writes a figure pattern on a target object by using a charged particle beam, the method includes inputting figure information on a figure pattern, and setting a quadrangular frame which encloses a part of the figure pattern, setting a plurality of mesh regions, each having a fixed size, in a region including a remaining part of the figure pattern, setting one of a dose and a dose modulation rate for a position of each of four corner points of the quadrangular frame, setting at least one of a dose and a dose modulation rate for modulating a dose, for each of the plurality of mesh regions, and generating the writing data, based on a data format that sequentially defines the figure information on the figure pattern, first dose information which is defined before or after the figure information and indicates the one of the dose and the dose modulation rate having been set for the position of the each of the four corner points of the quadrangular frame, and second dose information which indicates the one of the dose and the dose modulation rate having been set for the each of the plurality of mesh regions each having the fixed size.

BRIEF DESCRIPTION OF THE DRAWINGS

FIGS. 3A to 3C show an example of a data format with a dose modulation amount according to the first embodiment;

FIGS. 4A to 4C show another example of a data format with a dose modulation amount according to the first embodiment;

FIG. 12 shows another example of a data format with a dose modulation amount according to the second embodiment;

FIGS. 22A to 22C show an example of a figure pattern with a rotation angle and a data format with a dose modulation amount according to the fourth embodiment;

FIG. 27 shows an example of a data format with a dose modulation amount according to the sixth embodiment.

DETAILED DESCRIPTION OF THE INVENTION

Figure 17:
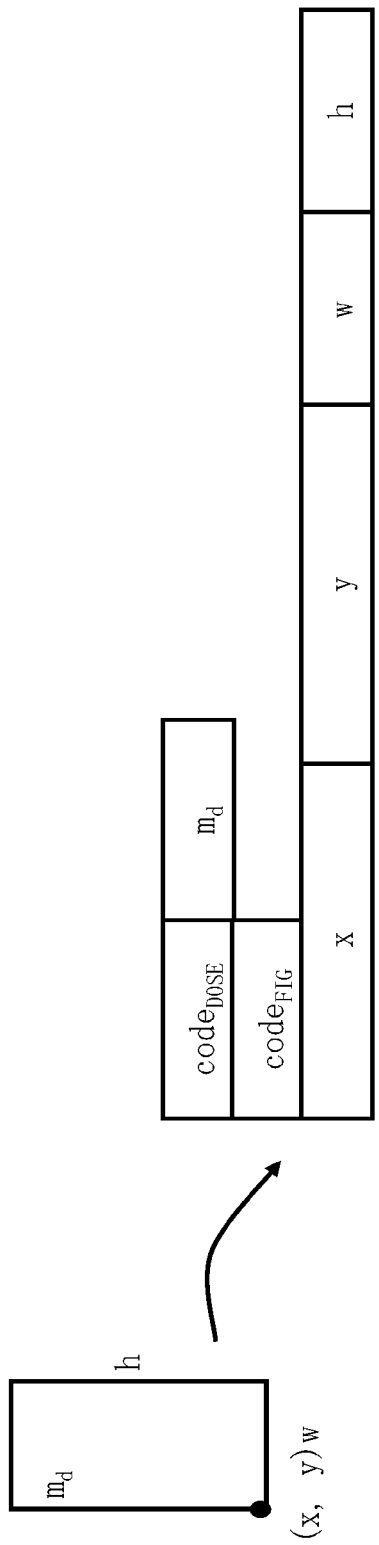
FIG. 17 illustrates an example of a data format of pattern data of a figure pattern including information on a dose modulation amount which modulates a dose.

FIG. 17 illustrates an example of a data format of pattern data of a figure pattern including information (data) on a dose modulation amount which modulates a dose. In FIG. 17, a quadrangular (rectangular, square, etc.) pattern whose size in the x direction is w and size in the y direction is h is shown as an example. The data format shown in FIG. 17 defines 1-byte code ($code_{DOSE}$) indicating a dose modulation amount, 2-byte dose modulation amount, 1-byte code ($code_{FIG}$) indicating a figure type, 3-byte (x) coordinate of a figure pattern, 3-byte (y) coordinate of a figure pattern, 2-byte x-direction size w, and 2-byte y-direction size h. Therefore, when pattern data of the figure pattern is generated using the data format shown in FIG. 17, it can be defined by the data amount of 1+2+1+3×2+2×2=14 bytes.

Figure 18:
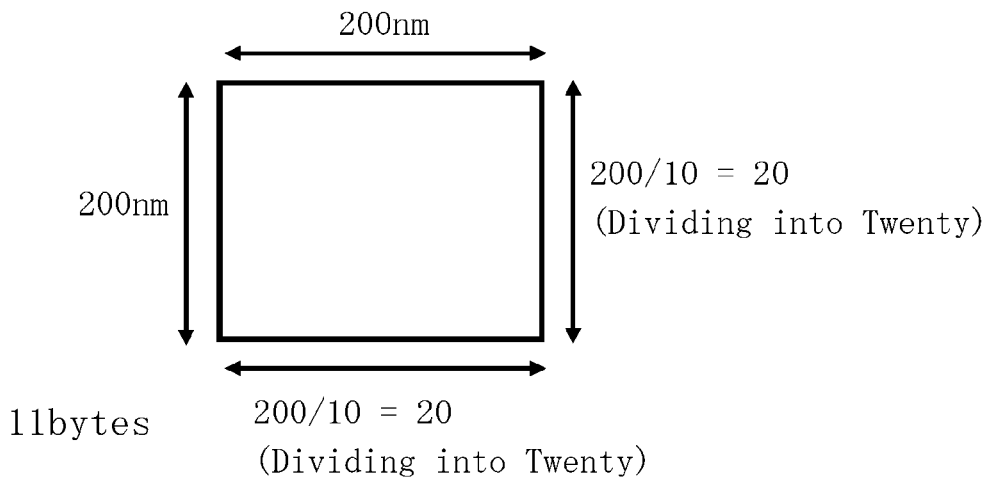
FIG. 18 shows a data amount of pattern data in the case of dividing into small figure patterns each for defining a necessary dose modulation amount.

FIG. 18 shows a data amount of pattern data in the case of dividing into small figure patterns each for defining a necessary amount of dose modulation. The example of FIG. 18 shows a quadrangular pattern of 200 nm×200 nm. When not defining the dose modulation amount, since the 1-byte code ($code_{DOSE}$) and the 2-byte dose modulation amount are unnecessary in the data format shown in FIG. 17, it can be define by the data amount of 11 bytes. However, for example, when defining the dose modulation amount by 10 nm size, it is necessary to divide the quadrangular pattern of FIG. 18 into twenty in both the x and y directions. Therefore, the number of figures increases from one to four hundred (20×20), and pattern data with the dose modulation amount for four hundred figures becomes necessary. When the data format of FIG. 17 is used, the data amount of 14×400=5600 bytes becomes necessary. Thus, in performing correction of the small influence range described above, there is a problem in that the data amount increases from 11 bytes to 5600 bytes, for example.

Figure 19:
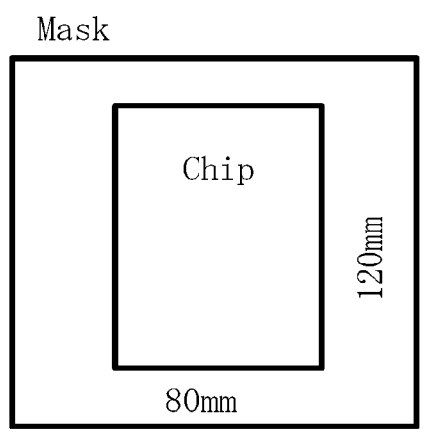
FIG. 19 illustrates, with respect to each target object, a data amount of pattern data in the case of dividing into small figure patterns each for defining a necessary dose modulation amount.

FIG. 19 illustrates, with respect to each target object, the data amount of pattern data in the case of dividing into small figure patterns each for defining a necessary dose modulation amount. FIG. 19 shows a case in which a chip region (writing region) of 80 mm×120 mm is formed on the exposure mask substrate. The chip region is on an assumption that a dose modulation amount map is generated. In the dose modulation amount map, the amount of dose modulation is defined using 10 bits, for example. When defining a dose modulation amount for each mesh region whose size is 10 nm, for example, the data amount of (80000000/10) nm×(120000000/10) nm×(10 bits/8 bits)=109 TB (terabytes) is needed for the dose modulation amount map.

According to ITRS (International Technology Roadmap for Semiconductors) report 2012, in the case of a pattern whose half pitch HP is from 28 nm to 10 nm, the data amount necessary per mask is from 2.2 TB to 2.9 TB. That is, even when just compared to this data amount, it turns out that the data amount of FIG. 19 is excessively large.

In the embodiments below, there will be described a method for generating writing data, using a data format that can reduce the amount of data even when it is necessary to define the dose according to a minute size.

In the embodiments below, there will be described a configuration in which an electron beam is used as an example of a charged particle beam. The charged particle beam is not limited to the electron beam, and other charged particle beam such as an ion beam may also be used.

First Embodiment

Figure 1:
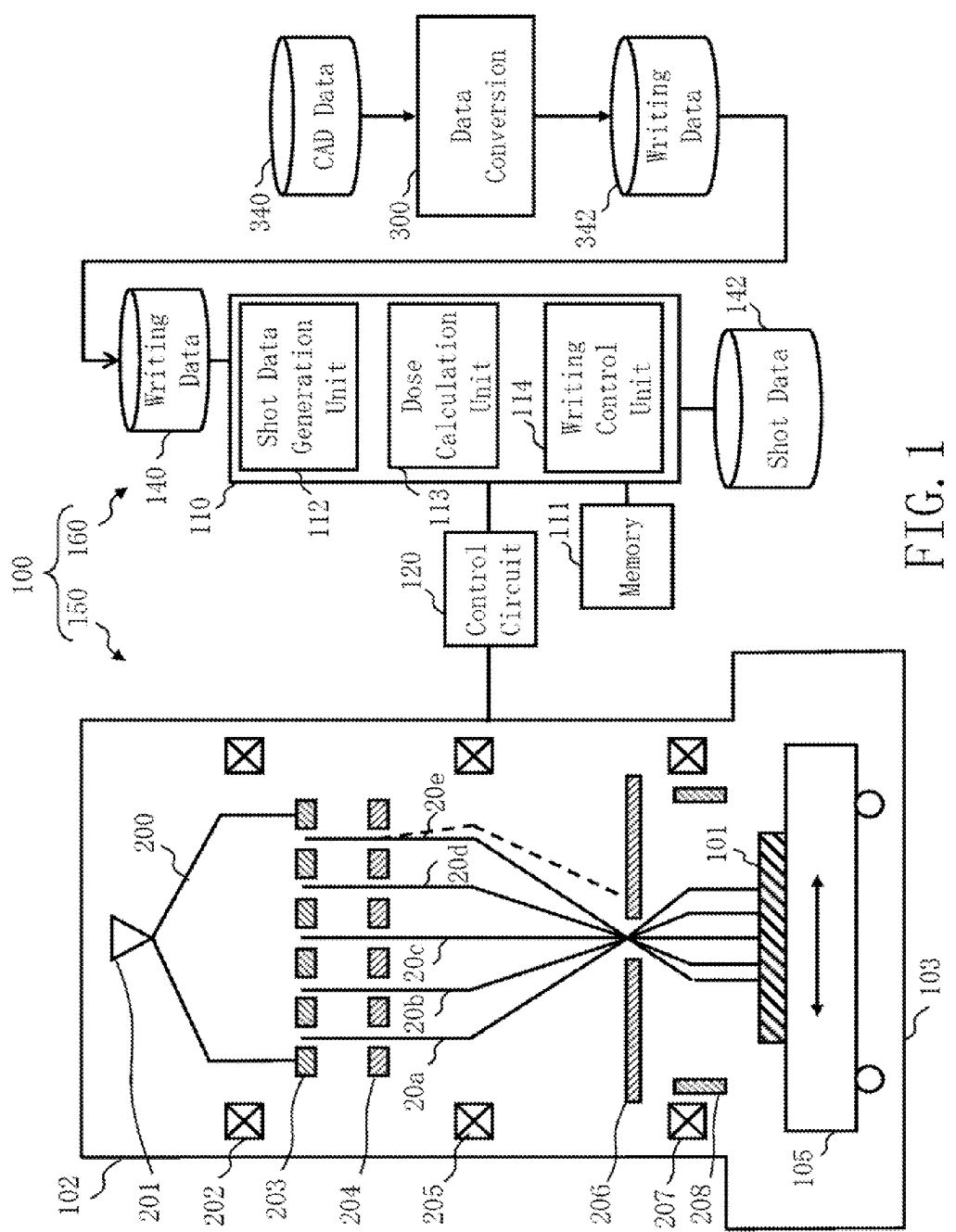
FIG. 1 is a schematic diagram showing a configuration of a writing system according to a first embodiment.

FIG. 1 is a schematic diagram showing a configuration of a writing or "drawing" system according to a first embodiment. As shown in FIG. 1, the writing system includes a writing apparatus 100 and a writing data conversion device 300.

In FIG. 1, the writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun 201, an illumination lens 202, a multi-beam forming plate 203, a blanking plate 204, a reducing lens 205, a limiting aperture member 206, an objective lens 207, and a deflector 208. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written.

The control unit 160 includes a control computer 110, a memory 111, a control circuit 120, and storage devices 140 and 142 such as magnetic disk drives. The control computer 110, the memory 111, the control circuit 120, and the storage devices 140 and 142 are connected with each other through a bus (not shown). In the control computer 110, there are arranged a shot data generation unit 112, a dose calculation unit 113, and a writing control unit 114. Each of the "units" such as the shot data generation unit 112, the dose calculation unit 113, and the writing control unit 114 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the shot data generation unit 112, the dose calculation unit 113, and the writing control unit 114, and data being operated are stored in the memory 111 each time.

Storage devices 340 and 342 such as magnetic disk drives are connected to the writing data conversion device 300 through a bus (not shown).

The writing data conversion device 300 and the storage devices 340 and 342 are connected through a network (not shown) to the control computer 110 of the writing apparatus 100. Layout data (CAD data) being design data is stored in the storage device 340. Then, data conversion is performed in the writing data conversion device 300 in order to generate writing data that can be input to the writing apparatus 100. The generated writing data is stored in the storage device 342.

FIG. 1 shows a configuration necessary for explaining the first embodiment. Other configuration elements generally necessary for the writing apparatus 100 may also be included. Moreover, input devices, such as a mouse and a keyboard, monitoring devices, external interface circuits, etc. maybe connected to the writing apparatus 100.

In order to perform writing processing by the writing apparatus 100, it is necessary to convert layout data to writing data that can be input to the writing apparatus 100. Although not shown, in the inside of the writing apparatus 100, correction processing of pattern size CD is generally performed with respect to dimensional variations resulting from a proximity effect that occurs by backscattering whose influence range is about 10 μm, a fogging effect whose influence range is on the order of mm, and a chromium loading effect whose influence range is on the order of mm. However, even using a dose which has been calculated in the writing apparatus, a correction residual error, etc. may exist. As a factor of the correction residual error, there is dimensional variation resulting from a phenomenon whose influence range is smaller than about 10 μm. For example, dimensional variation caused by a phenomenon whose influence range is about 100 nm can be considered. Then, for correcting the dimensional variation resulting from the phenomenon whose influence range is about 100 nm, it is necessary to define a dose or a dose modulation amount for each mesh size being about 1/10 of the influence range, for example, 10 nm. Therefore, at the stage before inputting writing data into the writing apparatus, a dose modulation amount is set for each minute size by a user. However, as described above, if it is defined for each mesh size of 10 nm, for example, the amount of writing data will be excessively large.

The dimensional variation amount caused by the phenomenon described above in one figure pattern and its adjoining figure patterns does not change rapidly but changes gradually. Therefore, information on a necessary dose or dose modulation amount (rate) does not need to be what changes rapidly but should be what changes gradually. Then, according to the first embodiment, there is used a data format that defines doses or dose modulation amounts (rates) for a plurality of representative points, not defining a dose or dose modulation amount (rate) for each minute size described above.

Figure 2:
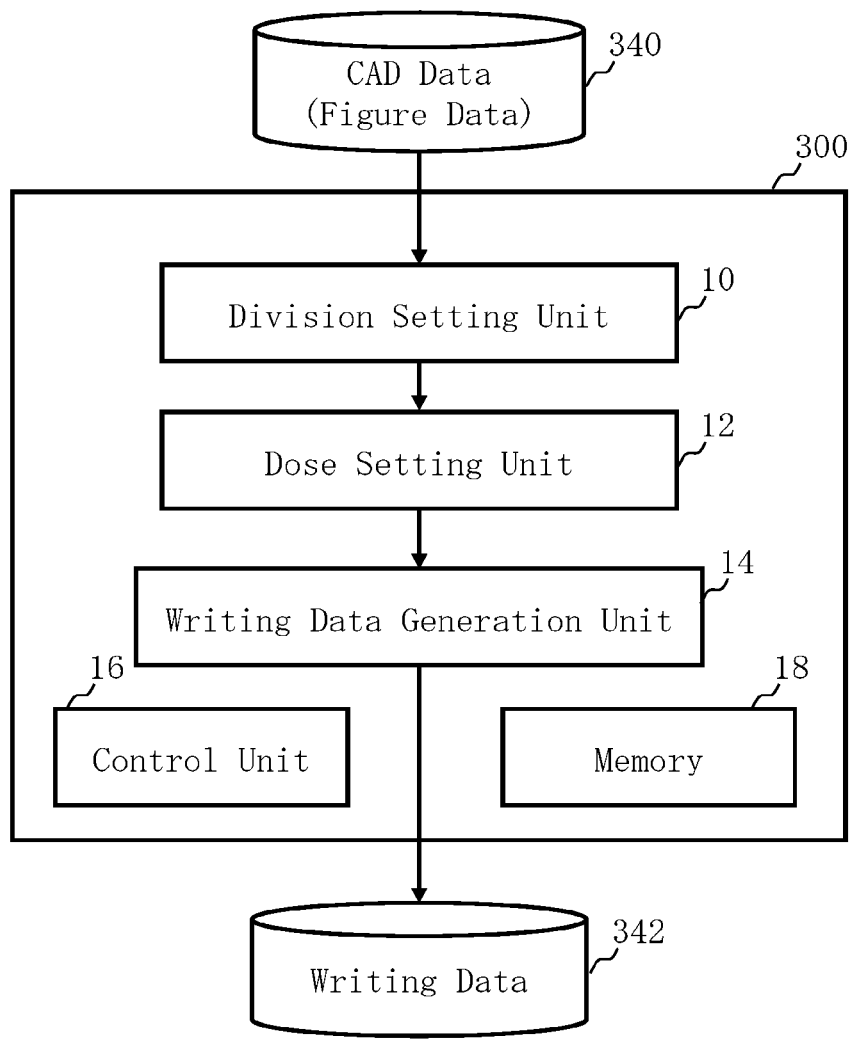
FIG. 2 is a schematic diagram showing a configuration of a writing data conversion device according to the first embodiment.

FIG. 2 is a schematic diagram showing a configuration of a writing data conversion device according to the first embodiment. As shown in FIG. 2, a division setting unit 10, a dose setting unit 12, a writing data generation unit 14, a control unit 16, and a memory 18 are arranged in the writing data conversion device 300. Each of the "units" such as the division setting unit 10, the dose setting unit 12, the writing data generation unit 14, and the control unit 16 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the division setting unit 10, the dose setting unit 12, the writing data generation unit 14, and the control unit 16, and data being operated are stored in the memory 18 each time.

FIG. 2 shows a configuration necessary for explaining the first embodiment. Other configuration elements generally necessary for the writing data conversion device 300 may also be included. For example, input devices, such as a mouse and a keyboard, monitoring devices, external interface circuits, etc. may be connected to the writing data conversion device 300.

FIGS. 3A to 3C show an example of a data format with a dose modulation amount according to the first embodiment. In this case, as shown in FIG. 3B, a quadrangular figure pattern 30 whose size in the x direction is w and size in the y direction is h is defined. In the example of FIG. 3B, the dose or dose modulation rate for each position of the four corner points $P_{00}$, $P_{10}$, $P_{01}$, and $P_{11}$ of the figure pattern 30 is defined. Here, the index (00) indicates the corner point at the lower left of the quadrangular figure pattern 30. The index (10) indicates the corner point at the lower right of the quadrangular figure pattern 30. The index (01) indicates the corner point at the upper left of the quadrangular figure pattern 30. The index (11) indicates the corner point at the upper right of the quadrangular figure pattern 30. The coordinates of the corner point at the lower left of the figure pattern 30 are denoted by ($x_0$, $y_0$).

The data format shown in FIG. 3A defines a 1-byte expression code ($code_{DO}$) indicating being a dose or a dose modulation amount (rate), and 2-byte doses (or dose modulation rates) $d_{00}$, $d_{10}$, $d_{11}$, and $d_{01}$ for the four corner points $P_{00}$, $P_{10}$, $P_{11}$ and $P_{01}$. Then, following the dose information (data), 1-byte figure type code ($code_{FIG}$) indicating a figure type, 3-byte figure pattern (x) coordinate, 3-byte figure pattern (y) coordinate, 2-byte x-direction size w, and 2-byte y-direction size h are defined. The 1-byte figure type code ($code_{FIG}$) indicating a figure type, the 3-byte figure pattern (x) coordinate, the 3-byte figure pattern (y) coordinate, the 2-byte x-direction size w, and the 2-byte y-direction size h indicate figure information on a figure pattern. The expression code ($code_{DO}$) and the doses (or dose modulation rates) $d_{00}$, $d_{10}$, $d_{11}$, and $_{d01}$ indicate dose information. The dose information may be defined after the figure information on a figure pattern. Therefore, the data format shown in FIG. 3A defines each quadrangular pattern by 1+2×4+1+3×2+2×2=20 bytes.

Thus, the writing data conversion device 300 generates writing data based on the data format that sequentially defines figure information on the figure pattern 30 and dose information which is defined before or after the figure information and indicates a dose or a dose modulation rate for the position of each corner point of the figure pattern 30.

Using the writing data such as described above, the dose for each needed size is calculated in the writing apparatus 100. The dose (or dose modulation amount) d(x, y) for the coordinate (x, y) shown in FIG. 3C is calculated by the linear interpolation (bi-linear interpolation) of an equation (1), for example. Thus, the dose of each position (x, y) in the figure pattern 30 can be calculated as described below.

$$d(x, y)=(1/w \cdot h)\{d_{00}(x_0+w-x)(y_0+h-y) +d_{10}(x-x_0)(y_0+h-y) +d_{01}(x_0+w-x)(y-y_0) +d_{11}(x-x_0)(y-y_0)\} \quad (1)$$

FIGS. 4A to 4C show another example of a data format with a dose modulation amount according to the first embodiment. As shown in FIG. 4B, the dose (or dose modulation amount (rate)) is defined for each position of added points $P_{01}$ and $P_{11}$, each of which is in the middle of the side, in addition to for the four corner points $P_{00}$, $P_{10}$, $P_{02}$, and $P_{12}$ of the figure pattern 30 which are similar to those in FIG. 3B. That is, in addition to the dose information such as described in FIG. 3B, the dose (or dose modulation amount (rate)) in the case of FIG. 4B is defined for the intersections $P_{01}$ and $P_{11}$, wherein the intersection $P_{01}$ is the intersection point between the left side of the figure pattern 30 and the parting line that divides the figure pattern 30 at the coordinate $y_1$ (y coordinate for division) into divisions arranged along the y-axis, and the intersection $P_{11}$ is the intersection point between the right side of the figure pattern 30 and the parting line. Although the figure pattern 30 is divided into divisions which are arranged along the y-axis in the example of FIG. 4B, it is not limited thereto. The figure pattern 30 may be divided into divisions arranged along the x-axis. In that case, the dose (or dose modulation amount (rate)) should be defined for an intersection point between the upper side of the figure pattern 30 and a parting line which divides the figure pattern 30 into divisions arranged along the x-axis, and an intersection point between the lower side of the figure pattern 30 and the parting line. In FIG. 4B, the index (00) indicates the corner point at the lower left of the quadrangular figure pattern 30. The index (10) indicates the corner point at the lower right of the quadrangular figure pattern 30. The index (02) indicates the corner point at the upper left of the quadrangular figure pattern 30. The index (12) indicates the corner point at the upper right of the quadrangular figure pattern 30. Moreover, the index (01) indicates the intersection point between the left side of the figure pattern 30 and the parting line that divides the figure pattern 30 into divisions arranged along the y-axis, and the index (11) indicates the intersection point between the right side of the figure pattern 30 and the parting line that divides the figure pattern 30 into divisions arranged along the y-axis. Moreover, the coordinates of the corner point at the lower left of the figure pattern 30 are denoted by ($x_0$, $y_0$. As shown in FIG. 4C, the dose (or dose modulation amount (rate)) for the coordinates (x, y) being a calculation target is calculated by the equation (1) using data on the four corners of a quadrangular frame which surrounds the coordinates (x, y) by four closest points for each of which the dose (or dose modulation amount (rate)) has been defined.

The data format shown in FIG. 4A defines 1-byte expression code ($code_{DD}$) indicating being a dose (or dose modulation amount (rate)), 2-byte figure pattern x-direction division number $ndiv_x$, 2-byte figure pattern y-direction division number $ndiv_y$, 3-byte division y-coordinate $y_1$, and 2-byte doses (or dose modulation rates) $d_{00}$, $d_{10}$, $d_{02}$, $d_{12}$, $d_{01}$, and $d_{11}$ for four corner points $P_{00}$, $P_{10}$, $P_{02}$, and $P_{12}$ and middle added points $P_{01}$ and $P_{11}$. Then, following the dose information (data), 1-byte figure type code ($code_{FIG}$) indicating a figure type, 3-byte figure pattern (x) coordinate, 3-byte figure pattern (y) coordinate, 2-byte x-direction size w, and 2-byte y-direction size h are defined. The 1-byte figure type code ($code_{FIG}$) indicating a figure type, the 3-byte figure pattern (x) coordinate, the 3-byte figure pattern (y) coordinate, the 2-byte x-direction size w, and the 2-byte y-direction size h indicate figure information on a figure pattern. The expression code ($code_{DD}$) the division number $ndiv_x$, the division number $ndiv_y$, the division height $y_1$, and the doses (or dose modulation rates) $d_{00}$, $d_{10}$, $d_{01}$, $d_{11}$, $d_{02}$, and $d_{12}$ indicate dose information. The dose information may be defined after the figure information on a figure pattern. Therefore, the data format for y-direction once division shown in FIG. 4A defines each quadrangular pattern by 1+2×2+3+2×6+1+3×2+2×2=31 bytes.

Figures 5A, 5B:
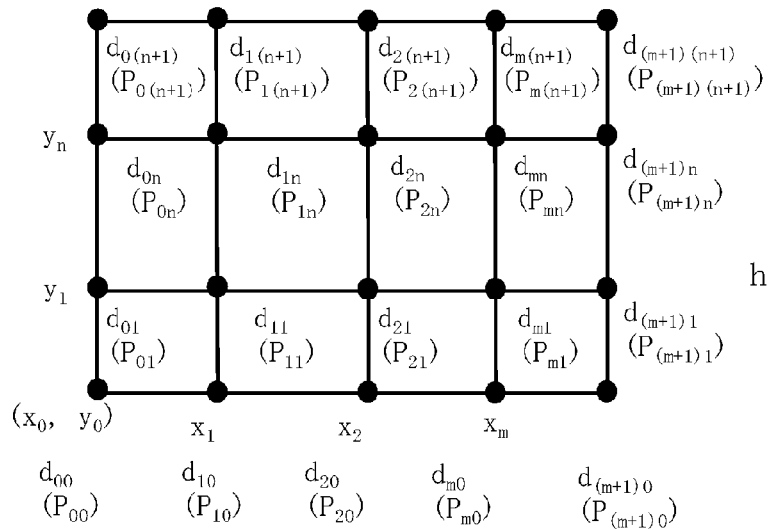
FIGS. 5A and 5B show another example of a data format with a dose modulation amount according to the first embodiment.

FIGS. 5A and 5B show another example of a data format with a dose modulation amount according to the first embodiment. As shown in FIG. 5B, the dose (or dose modulation amount (rate)) is defined, in addition to for the four corner points of the quadrangular figure pattern 30, for each intersection between each side of the figure pattern 30 and a parting line which divides the figure pattern 30 into divisions arranged along the x-axis or the y-axis, and for each intersection between the parting lines. FIG. 5B shows the case where the figure pattern 30 is divided m times in the x direction and n times in the y direction. In the example of FIG. 5B, the figure pattern 30 is divided at coordinates $x_1$ to $x_m$ (x coordinate for division) in the x direction, and at coordinates $y_1$ to $y_n$, (y coordinate for division) in the y direction. When defining the coordinates of the corner point at the lower left of the figure pattern 30 to be ($x_0$, $y_0$) the x coordinate of each position for which the dose (or dose modulation amount (rate)) is defined is $x_0$, $x_1$, . . . , $x_m$, or $x_{m+1}$ in order in the x direction, and the y coordinate of each position is $y_0$, $y_1$, . . . , $y_n$, or $y_{n+1}$ in order in the y direction. Therefore, indices are represented by combination of values 0, 1, . . . , m, or m+1 in order in the x direction, and 0, 1, . . . , n, or n+1 in order in the y direction.

The data format shown in FIG. 5A defines 1-byte expression code ($code_{DD}$) indicating being a dose (or dose modulation amount (rate)) 2-byte figure pattern x-direction division number $ndiv_x$, 2-byte figure pattern y-direction division number $ndiv_y$, 3-byte division x-coordinates $x_1$ to $x_m$, 3-byte division y-coordinates $y_1$ to $y_n$, and doses (or dose modulation amounts (rates)) $d_{00}$, $d_{10}$, $d_{20}$, $d_{m0}$, $d_{(m+1)0}$, . . . , $d_{0(n+1)}$, $d_{1(n+1)}$, $d_{2(n+1)}$, $d_{m(n+1)}$, and $d_{(m+1)\,(n+1)}$ for the positions of the four corner points of the figure pattern 30, intersections each between each side of the figure pattern 30 and a parting line which divides the figure pattern 30 into divisions arranged along the x-axis or the y-axis, and intersections each between the parting lines. Then, following the dose information (data), 1-byte figure type code ($code_{FIG}$) indicating a figure type, 3-byte figure pattern (x) coordinate, 3-byte figure pattern (y) coordinate, 2-byte x-direction size w, and 2-byte y-direction size h are defined.

The 1-byte figure type code ($code_{FIG}$) indicating a figure type, the 3-byte figure pattern (x) coordinate, the 3-byte figure pattern (y) coordinate, the 2-byte x-direction size w, and the 2-byte y-direction size h indicate figure information on a figure pattern. The expression code ($code_{DD}$), the division number $ndiv_x$, the division number $ndiv_y$, the division x-coordinates $x_1$ to $x_m$, the division y-coordinates $y_1$ to $y_n$, and the doses (or dose modulation amounts (rates)) $d_{00}$, $d_{10}$, $d_{20}$, $d_{m0}$, $d_{(m+1)0}$, . . . , $d_{0(n+1)}$, $d_{1(n+1)}$, $d_{2(n-1)}$, $d_{m(n+1)}$, and $d_{(m+1)\,(n+1)}$ for the positions of the four corner points, intersections each between each side of the figure pattern 30 and a parting line, and intersections each between the parting lines indicate dose information. The dose information may be defined after the figure information on a figure pattern. Therefore, the data format for x-direction m-times division and y-direction n-times division shown in FIG. 5A defines each quadrangular pattern by $1+2\times2+3\times(m+n)+2\times(m+2)(n+2)+1+3\times2+2\times2=(24+2mn+7m+7n)$ bytes.

As described above, the writing data conversion device 300 uses, as dose information, in addition to doses (or dose modulation amounts (rates)) for the positions of corner points of the figure pattern 30, doses (or dose modulation amounts (rates)) for intersections each between any one side of the figure pattern 30 and a parting line (or parting lines) which divides the figure pattern 30 into divisions arranged along at least one of the x-axis and the y-axis.

The method for generating writing data of the data format described above executes a division setting step, a dose setting step, and a writing data generation step.

In the division setting step, the division setting unit 10 reads CAD data from the storage device 340, and sets, for each figure pattern, an x-direction division number $ndiv_x$ and a y-direction division number $ndiv_y$. Moreover, it sets each coordinate for division. When the division number $ndiv_x=m$, x-direction coordinates $x_1$ to $x_m$ (x coordinate for division) are set. When the division number $ndiv_y=n$, y-direction coordinates $y_1$ to $y_n$ (y coordinate for division) are set. When not dividing, the x-direction division number $ndiv_x$ and the y-direction division number $ndiv_y$ should be set to be zero. Alternatively, when not dividing, the division setting step may be omitted.

In the dose setting step, the dose setting unit 12 sets, for each figure pattern, the dose (or dose modulation amount (rate)) for each of the positions obtained by combining x coordinates $x_0$, $x_1$, . . . , $x_m$, and $x_{n+1}$ including x coordinates $x_0$ and $x_{m+1}$ of the four corner points of the figure pattern concerned, and y coordinates $y_0$, $y_1$, . . . , $y_n$, and $y_{n+1}$ including y coordinates $y_0$ and $y_{+1}$ of the four corner points thereof. When not dividing, the dose (or dose modulation amount (rate)) for each of the positions of the four corner points should be set.

In the writing data generation step, the writing data generation unit 14 generates pattern data (writing data) for each figure pattern, based on a data format that sequentially defines figure information on the figure pattern concerned, and dose information which is defined before or after the figure information and indicates doses (or dose modulation amounts (rates)) for the positions described above including the four corner points.

The control unit 16 outputs writing data composed collectively of generated pattern data of each figure pattern to the storage device 342 and stores it therein. Thus, the writing data to be input to the writing apparatus 100 which writes a figure pattern on the target object 101 with the electron beam 200 is generated.

Figure 6:
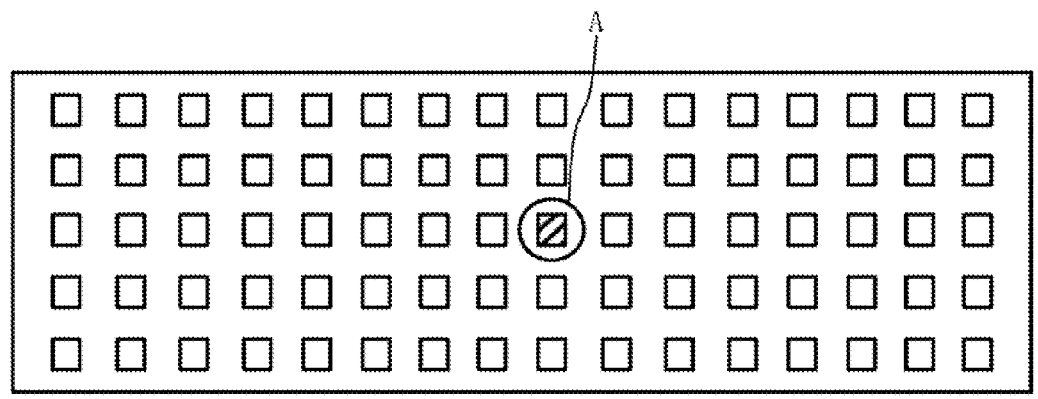
FIG. 6 shows an evaluation pattern for describing effects of the first embodiment.

FIG. 6 shows an evaluation pattern for describing effects of the first embodiment. In FIG. 6, a plurality of squares whose side is 200 nm, for example, are arrayed. The square figure patterns are arrayed having a space (space portion) of 200 nm therebetween. Now, a central square (A) is regarded as an evaluation target in the array arrangement shown in FIG. 6. For example, when a dose (or dose modulation amount (rate)) is needed for every 10 nm, it is necessary to have a data amount of 5600 bytes as described above according to the conventional method. When a dose map is generated in addition to the pattern data, if performing calculation for a region of 400 nm×400 nm being one pitch of the square (A), the data amount of $(400/10)\times(400/10)\times(10/8)=2000$ bytes is needed. While on the other hand, according to the first embodiment, the data amount can be suppressed as described below.

Figure 7:
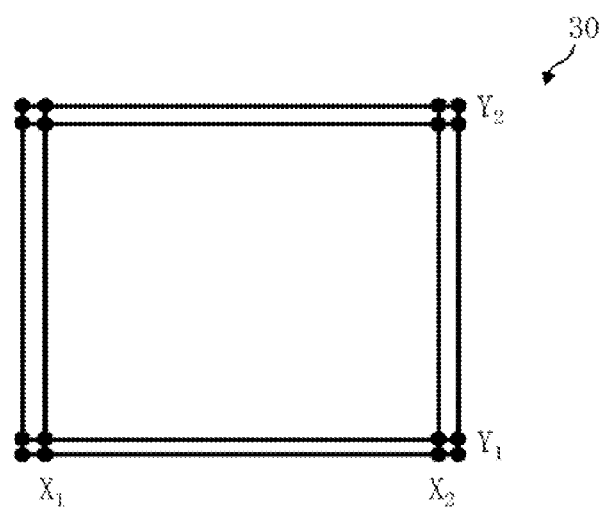
FIG. 7 shows an example of the division number of an evaluation pattern for describing effects of the first embodiment.

FIG. 7 shows an example of the division number of an evaluation pattern for describing effects of the first embodiment. FIG. 7 shows the case of dividing into two in the x direction and two in the y direction in order to set positions for which doses (or dose modulation amounts (rates)) are defined. Therefore, the doses (or dose modulation amounts (rates)) for the twelve positions in addition to the four corner points are defined in the pattern data of the figure pattern 30. Accordingly, when generating pattern data based on this data format, it is possible to reduce the data amount to 60 bytes totally, that is figure information of 11 bytes and dose information of 49 bytes.

Figures 8, 9:
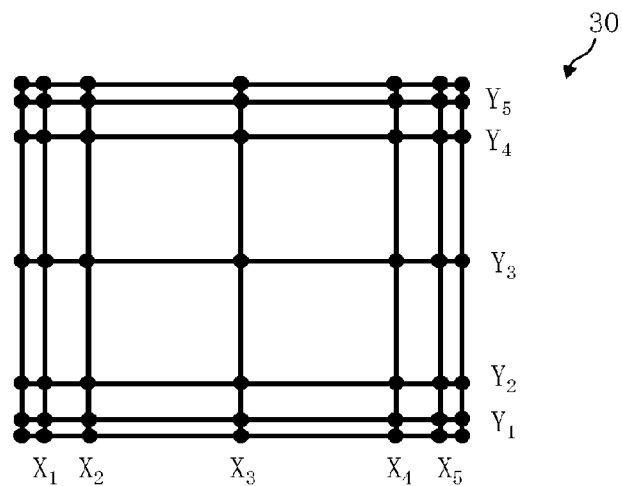
FIG. 8 shows another example of the division number of an evaluation pattern for describing effects of the first embodiment.
FIG. 9 shows a relation between the number of division and the amount of data of the first embodiment.

FIG. 8 shows another example of the division number of an evaluation pattern for describing effects of the first embodiment. FIG. 8 shows the case of dividing into five in the x direction and five in the y direction in order to set positions for which doses (or dose modulation amounts (rates)) are defined. Therefore, the doses (or dose modulation amounts (rates)) for the forty-five positions in addition to the four corner points are defined in the pattern data of the figure pattern 30. Accordingly, when generating pattern data based on this data format, it is possible to reduce the data amount to 144 bytes totally, that is figure information of 11 bytes and dose information of 133 bytes.

FIG. 9 shows a relation between the number of division and the amount of data of the first embodiment. As shown in FIG. 9, when dividing into two in the x direction and two in the y direction in order to set positions for which doses (or dose modulation amounts (rates)) are defined, it is possible to reduce the data amount of the pattern data of a figure to 60 bytes. When dividing into three in the x direction and three in the y direction, it is possible to reduce the data amount of the pattern data of a figure to 84 bytes. When dividing into four in the x direction and four in the y direction, it is possible to reduce the data amount of the pattern data of a figure to 112 bytes. When dividing into five in the x direction and five in the y direction, it is possible to reduce the data amount of the pattern data of a figure to 114 bytes.

As described above, according to the first embodiment, the amount of pattern data (writing data) can be greatly reduced.

Then, the writing apparatus 100 inputs the writing data from the storage device 342 (the writing data is transferred to the writing apparatus 100 from the storage device 342), and stores it in the storage device 140. Then, writing processing is performed in the writing apparatus 100.

In the shot data generation step, the shot data generation unit 112 reads writing data from the storage device 140, and generates apparatus-specific shot data. The shot data generation unit 112 reads writing data from the storage device 140, and calculates the area density of a pattern arranged in each of a plurality of pixel regions (mesh regions) obtained by virtually dividing the writing region of the target object 101 or a chip region to be written into meshes. For example, first, the writing region of the target object 101 or a chip region to be written is divided into strip-shaped stripe regions each having a predetermined width. Then, each stripe region is virtually divided into a plurality of pixel regions described above. It is preferable that the size of the pixel region is, for example, a beam size, or smaller than the beam size. For example, the size of the pixel region is preferably about 10 nm. For example, corresponding writing data is read, for each stripe region, from the storage device 140, and a plurality of figure patterns defined in the writing data are assigned to pixels. Then, the area density of a figure pattern arranged in each pixel region is calculated.

In the dose calculation step, first, the dose calculation unit 113 calculates a dose (or dose modulation amount (rate)) $d(x, y)$ for a desired position $(x, y)$ by using dose information defined in the writing data. The calculation method for the dose (or dose modulation amount (rate)) $d(x, y)$ is, for example, linear interpolation similar to that applied in the equation (1). As the coordinates $(x_0, y_0)$ in the equation (1), the coordinates used are at the lower left corner point of a quadrangular frame using four closest points for surrounding, which are around the calculation target coordinates $(x, y)$ and for each of which the dose (or dose modulation amount (rate)) has been defined. As the width dimension w in the equation (1), the width dimension of the quadrangular frame using four closest points for surrounding is used. As the height dimension h in the equation (1), the height dimension of the quadrangular frame using four closest points for surrounding is used. As the dose (or dose modulation amount (rate)) $d_{00}$ in the equation (1), the dose (or dose modulation amount (rate)) for the position at the lower left corner point of the quadrangular frame using four closest points for surrounding is used. As the dose (or dose modulation amount (rate)) $d_{10}$ in the equation (1), the dose (or dose modulation amount (rate)) for the position at the lower right corner point of the quadrangular frame using four closest points for surrounding is used. As the dose (or dose modulation amount (rate)) $d_{01}$ in the equation (1), the dose (or dose modulation amount (rate)) for the position at the upper left corner point of the quadrangular frame using four closest points for surrounding is used. As the dose (or dose modulation amount (rate)) $d_{11}$ in the equation (1), the dose (or dose modulation amount (rate)) for the position at the upper right corner point of the quadrangular frame using four closest points for surrounding is used.

Although, as an example, the dose (or dose modulation amount (rate)) $d(x, y)$ is calculated by linear interpolation in this case, it is not limited thereto. The dose (or dose modulation amount (rate)) for each defined point may be approximated by a predetermined polynomial. For example, it may be approximated by a second or more order polynomial. Then, the dose (or dose modulation amount (rate)) $d(x, y)$ for a desired position $(x, y)$ may be calculated using an obtained approximate expression.

The dose calculation unit 113 calculates a dose $D(x, y)$ for each pixel position $(x, y)$ by using an obtained $d(x, y)$. The dose $D(x, y)$ can be calculated as a value obtained by multiplying a base dose Dbase by the dose (or dose modulation amount (rate)) $d(x, y)$ and the area density. If a proximity effect correction amount is not taken into consideration in the dose (dose modulation amount) defined in the writing data, it is also preferable to multiply the base dose Dbase further by a proximity effect correction radiation coefficient which corrects a proximity effect. Alternatively, it is also preferable to multiply the base dose Dbase further by a correction coefficient, such as a fogging effect correction radiation coefficient which corrects a fogging effect, and a loading effect correction radiation coefficient which corrects a loading effect. The correction calculation for each phenomenon such as the proximity effect correction may be performed by the same method as the conventional one.

In the writing step, the writing control unit 114 outputs a control signal to the control circuit 120 so that writing processing may be performed. The control circuit 120 inputs data of each correction dose for each pixel, and controls the writing unit 150, based on the control signal from the writing control unit 114, and the writing unit 150 writes a figure pattern concerned on the target object 100 by the multi-beams 20. Specifically, it operates as described below.

The electron beam 200 emitted from the electron gun 201 (emitter) almost perpendicularly (e.g., vertically) illuminates the whole of the multi-beam forming plate 203 by the illumination lens 202. Holes (openings) of m rows long (y direction) and n columns wide (x direction) (m≥2, n≥2) are formed, like a matrix, at a predetermined arrangement pitch in the multi-beam forming plate 203. For example, holes of 512 (rows)×8 (columns) are formed. Each of the holes is a quadrangle of the same dimensional shape. Alternatively, each of the holes can be a circle of the same circumference. The region including all the plurality of holes is irradiated by the electron beam 200. For example, a plurality of quadrangular electron beams (multi-beams) 20a to 20e are formed by making portions of the electron beam 200 irradiating the positions of a plurality of holes individually pass through a corresponding hole of the plurality of holes of the multi-beam forming plate 203. The multi-beams 20a to 20e individually pass through a corresponding blanker of the blanking plate 204. In the blanking plate 204, there are formed passage holes (openings), through which multiple beams individually pass, at the positions each corresponding to each hole of the multi-beam forming plate 203. A pair of electrodes (blanker) for blanking deflection is arranged in such a manner that each electrode is at the opposite side of and close to each passage hole. That is, a plurality of blankers are arranged to be corresponding to the number of beams. Each blanker deflects (performs blanking deflection) the individually passing electron beam 20. The multi-beams 20a, 20b, . . . , 20e having passed through the blanking plate 204 are reduced by the reducing lens 205, and go toward the hole in the center of the limiting aperture member 206. At this stage, the electron beam 20 which was deflected by a corresponding blanker of the blanking plate 204 deviates from the hole in the center of the limiting aperture member 206 (blanking aperture member) and is blocked by the limiting aperture member 206. On the other hand, the electron beam 20 which was not deflected by a corresponding blanker of the blanking plate 204 passes through the hole in the center of the limiting aperture member 206 as shown in FIG. 1. Blanking control is performed by ON/OFF of the individual blanking mechanism so as to control ON/OFF of beams. Thus, the limiting aperture member 206 blocks each beam which was deflected to be a beam OFF state by the individual blanking mechanism. Then, a beam of one shot is formed by a beam having been formed during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 in order that respective beam irradiation positions on the target object 101 are irradiated. While the XY stage 105 is continuously moving, controlling is performed by the deflector 208 so that irradiation positions of beams may follow the movement of the XY stage 105, for example. The multi-beams 20 of one-time irradiation are ideally aligned at pitches obtained by multiplying the arrangement pitch of a plurality of holes of the multi-beam forming plate 203 by a desired reduction ratio described above. The writing apparatus 100 performs a writing operation by the method of continuously irradiating shot beams in order, and when writing a desired pattern, a beam required according to the pattern is controlled to be ON by blanking control.

As described above, according to the first embodiment, it is possible to eliminate the necessity of defining dose information for each minute size. Furthermore, it is possible to generate writing data regardless of the correction size of the dose. Therefore, the amount of data can be reduced. Moreover, although conventionally a dose map (or dose modulation amount (rate)) is generated even for a region where no figure exists, since according to the first embodiment a dose map is generated at the point where a figure exists, it is possible to reduce the data amount even from this point of view. Moreover, since the position of a parting line can be set as variably, it is easy to generate grids with variable mesh sizes. Therefore, it becomes easy to generate a more-compressed dose (or dose modulation amount (rate)) map.

Second Embodiment

In the first embodiment, there has been described a data format that defines, for each figure pattern, the dose (or dose modulation amount (rate)) for a position, such as a corner point of the figure pattern concerned. In other words, there has been described a data format in which the shape itself of each figure pattern is used for a dose (or dose modulation amount (rate)) map. However, it is not limited thereto. In a second embodiment, there will be described a data format in which, using at least one figure pattern as a combination being a group, the dose (or dose modulation amount (rate)) is defined for each group. In the second embodiment, the structure of the writing apparatus 100 is the same as that of FIG. 1. The contents of the present embodiment are the same as those of the first embodiment other than what is described below.

Figure 10:
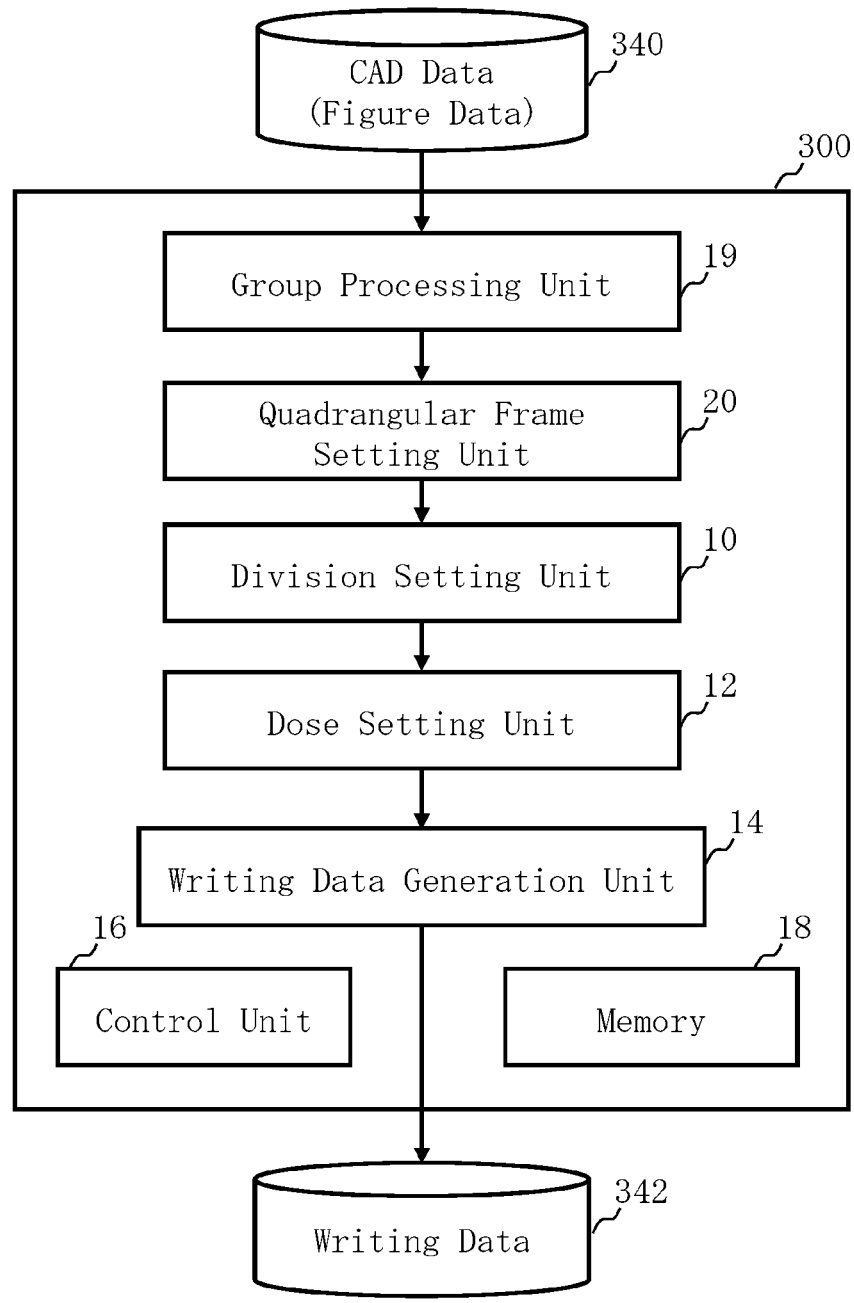
FIG. 10 is a schematic diagram showing a configuration of a writing data conversion device according to a second embodiment.

FIG. 10 is a schematic diagram showing a configuration of a writing data conversion device according to the second embodiment. FIG. 10 is the same as FIG. 2 except that a group processing unit 19 and a quadrangular frame setting unit 20 are added in the writing data conversion device 300. Each of the "units" such as the division setting unit 10, the dose setting unit 12, the writing data generation unit 14, the control unit 16, the group processing unit 19, and the quadrangular frame setting unit 20 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the division setting unit 10, the dose setting unit 12, the writing data generation unit 14, the control unit 16, the group processing unit 19, and the quadrangular frame setting unit 20, and data being operated are stored in the memory 18 each time.

FIG. 10 shows a configuration necessary for explaining the second embodiment. Other configuration elements generally necessary for the writing data conversion device 300 may also be included. Similarly to the first embodiment, for example, input devices, such as a mouse and a keyboard, monitoring devices, external interface circuits, etc. may be connected to the writing data conversion device 300.

FIGS. 11A to 11G illustrate figure pattern groups and a dose definition position according to the second embodiment. FIGS. 11A to 11F show examples of groups each composed of continuously connected figure patterns. Here, each of the figure pattern groups is composed of continuous quadrangular figure patterns. According to the second embodiment, a dose (or dose modulation amount (rate)) map is generated for each group while regarding continuous figure patterns as one group.

In the group processing step, the group processing unit 19 reads CAD data defining figure information on a plurality of figure patterns from the storage device 340, and performs grouping of a plurality of figure patterns defined in the CAD data into at least one group composed of continuous figure patterns. When there is only one combination of continuous figure patterns, only one group is formed. When a plurality of combinations each composed of continuous figure patterns are defined, a plurality of groups are formed. For example, grouping is performed regarding one combination of continuous figure patterns shown in FIG. 11C as one group. The grouping is similarly performed for the combinations each composed of continuous figure patterns shown in FIGS. 11A to 11F.

Figure 11:
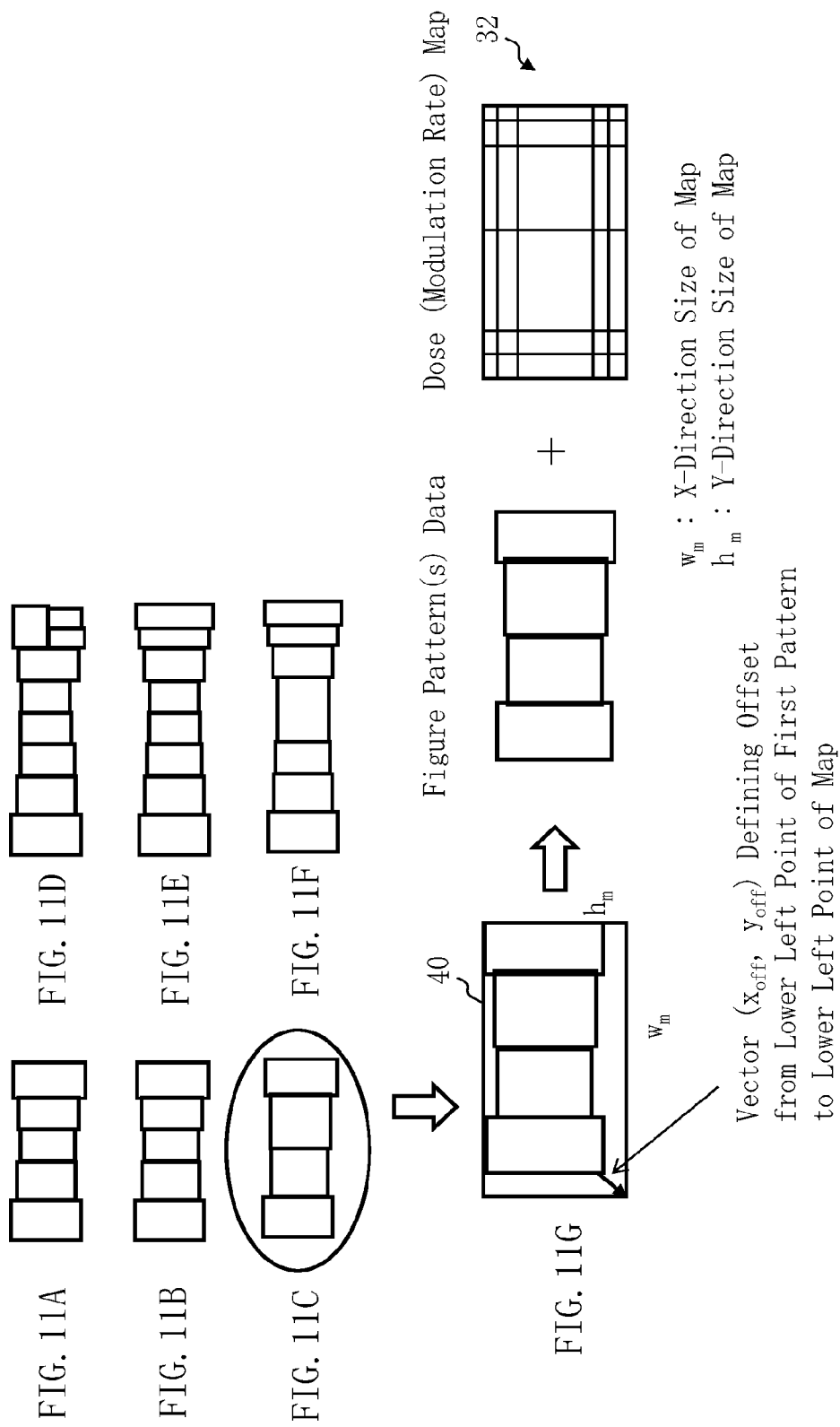
FIGS. 11A to 11G illustrate figure pattern groups and a dose definition position according to the second embodiment.

In the quadrangular frame setting step, the quadrangular frame setting unit 20 sets, for each group, a quadrangular frame which encloses figure patterns in the group concerned. The quadrangular frame is preferably a circumscribed quadrangle enclosing figure patterns, for example. However, it is not limited thereto, and, as shown in FIG. 11G, a quadrangular frame 40 may be a little larger than the circumscribed quadrangle. For example, in the case of setting a parting line, to be described later, in accordance with a predetermined grid, the quadrangular frame 40 itself may be set in accordance with the grid. According to the second embodiment, the quadrangular frame 40 is used as a dose (or dose modulation amount (rate)) map. As shown in FIG. 11G, the quadrangular frame setting unit 20 defines the quadrangular frame 40 (map) to have an x-direction size $w_m$, and a y-direction size $h_m$. Moreover, the quadrangular frame setting unit 20 defines an offset amount ($x_{off}$, $y_{off}$) from the reference position (e.g., lower left corner) of the first (e.g., left end) figure pattern in the figure patterns of the group concerned enclosed by the quadrangular frame 40 to the reference position (e.g., lower left corner) of the quadrangular frame 40 (map). Therefore, in the pattern data (writing data) for the figure pattern group of figure patterns enclosed by the quadrangular frame 40 shown in FIG. 11G, there are defined figure information on the figure patterns and dose information that regards the quadrangular frame 40 as a dose (or dose modulation amount (rate)) map 32.

In the division setting step, the division setting unit 10 sets, for each group, an x-direction division number $ndiv_x$ and a y-direction division number $ndiv_y$ of the quadrangular frame 40. Moreover, it sets each coordinate for division. When the division number $ndiv_x$=m, x-direction coordinates $x_1$ to $x_m$ (x coordinate for division) are set. When the division number $ndiv_y$=n, y-direction coordinates $y_1$ to $y_n$ (y coordinate for division) are set. When not dividing, the x-direction division number $ndiv_x$ and the y-direction division number $ndiv_y$ should be set to be zero. Alternatively, when not dividing, the division setting step may be omitted. The contents of the dividing method may be the same as those described with reference to FIGS. 4A to 4C, FIGS. 5A and 5B, and FIG. 6. In that case, the figure pattern should be read as the quadrangular frame 40.

In the dose setting step, the dose setting unit 12 sets, for each group, the dose (or dose modulation amount (rate)) for each of the positions obtained by combining x coordinates $x_0$, $x_1$, . . . , $x_m$, and $x_{m+1}$, including x coordinates $x_0$ and $x_{m+1}$ of the four corner points of the quadrangular frame 40 concerned, and y coordinates $y_0$, $y_1$, . . . , $y_n$, and $y_{n+1}$ including y coordinates $y_0$ and $y_{n+1}$ of the four corner points thereof. When not dividing, the dose (or dose modulation amount (rate)) for each of the positions of the four corner points should be set.

FIG. 12 shows another example of a data format with a dose modulation amount according to the second embodiment. As shown in FIG. 12, the dose (or dose modulation amount (rate)) is defined, in addition to for the four corner points of the quadrangular frame 40, for each intersection between each side of the quadrangular frame 40 and a parting line which divides the quadrangular frame 40 into divisions arranged along the x-axis or the y-axis, and for each intersection between the parting lines. FIG. 12 shows the case where the quadrangular frame 40 is divided m times in the x direction and n times in the y direction. In the example of FIG. 12, the quadrangular frame 40 is divided at coordinates $x_1$ to $x_m$ (x coordinate for division) in the x direction, and at coordinates $y_1$ to $y_n$ (y coordinate for division) in the y direction. When defining the coordinates of the corner point at the lower left of the quadrangular frame 40 to be ($x_0$, $y_0$), the x coordinate of each position for which the dose (or dose modulation amount (rate)) is defined is $x_0$, $x_1$, . . . , $x_m$, or $x_{m-1}$ in order in the x direction, and the y coordinate of each position is $y_0$, $y_1$, . . . , $y_n$, or $y_{n+1}$ in order in the y direction. Therefore, indices are represented by combination of values 0, 1, . . . , m, or m+1 in order in the x direction, and 0, 1, . . . , n, or n+1 in order in the y direction.

In the writing data generation step, the writing data generation unit 14 generates pattern data (writing data), for each group, based on a data format that sequentially defines figure information on figure patterns forming the group concerned, and dose information which is defined before or after the figure information and indicates doses (or dose modulation amounts (rates)) for the positions of the four corner points of the quadrangular frame 40. The generated pattern data (writing data) is output to the storage device 342 and stored therein.

The data format shown in FIG. 12 defines 1-byte expression code ($code_{DD2}$) indicating being a dose (or dose modulation amount (rate)), 2-byte quadrangular frame 40 x-direction division number $ndiv_x$, 2-byte quadrangular frame 40 y-direction division number $ndiv_y$, 3-byte x-direction offset amount $x_{off}$, 3-byte y-direction offset amount $y_{off}$, 2-byte quadrangular frame 40 x-direction size $w_m$, 2-byte quadrangular frame 40 y-direction size $h_m$, 3-byte division x-coordinates $x_1$ to $x_m$, 3-byte division y-coordinates $y_1$ to $y_n$, and doses (or dose modulation amounts (rates)) $d_{00}$, $d_{10}$, $d_{20}$, $d_{m0}$, $d_{(m+1)0}$, . . . , $d_{0(n+1)}$, $d_{1(n+1)}$, $d_{2(n-1)}$, $d_{m(n+1)}$, and $d_{(m+1)(n+1)}$ for the positions of the four corner points of the quadrangular frame 40, intersections each between each side of the quadrangular frame 40 and a parting line which divides the quadrangular frame 40 into divisions arranged along the x-axis or the y-axis, and intersections each between the parting lines. Then, following the dose information (data), there are defined 1-byte expression code ($code_{NR}$) indicating a general expression for just repeating each figure information, 1-byte figure type code ($code_{FIG}$) indicating a figure type, 2-byte figure pattern group number, and 3-byte figure pattern (X) coordinate, 3-byte figure pattern (Y) coordinate, 2-byte x-direction size W, and 2-byte y-direction size H for each of figure patterns 1 to N forming a figure pattern group.

The 1-byte expression code ($code_{NR}$), the 1-byte figure type code ($code_{FIG}$) indicating a figure type, the 2-byte figure pattern group number, and the 3-byte figure pattern (X) coordinate, the 3-byte figure pattern (Y) coordinate, the 2-byte x-direction size W, and the 2-byte y-direction size H for each of figure patterns 1 to N forming a figure pattern group indicate figure information on the figure pattern group. The expression code ($code_{DD2}$) the division number $ndiv_x$, the division number $ndiv_y$, the offset amount ($x_{off}$, $y_{off}$), the quadrangular frame 40 x-direction size $w_m$, the quadrangular frame 40 y-direction size $h_m$, the x-coordinates $x_1$ to $x_n$, the y-coordinates $y_1$ to $y_n$, and the doses (or dose modulation amounts (rates)) $d_{00}$, $d_{10}$, $d_{20}$, $d_{m0}$, $d_{(m+1)0}$, . . . , $d_{0(n+1)}$, $d_{1(n+1)}$, $d_{2(N+1)}$, $d_{m(n-1)}$, and $d_{(m+1)(n+1)}$ for the positions of the four corner points, intersections each between each side of the quadrangular frame 40 and a parting line, and intersections each between the parting lines indicate dose information. The dose information may be defined after the figure information on a figure pattern. Therefore, the data format for x-direction m-times division and y-direction n-times division shown in FIG. 12 defines each quadrangular pattern (group: continuously connected figure patterns) by 1+2×2+3×2+2×2+3×(m+n)+2×(n+2)+1+1+2+N·(3×2+2×2)=(27+2mn+7m+7n+10N) bytes.

As described above, the writing data conversion device 300 uses, as dose information, in addition to doses (or dose modulation amounts (rates)) for the positions of corner points of the quadrangular frame 40, doses (or dose modulation amounts (rates)) for intersections each between any one side of the quadrangular frame 40 and a parting line (or parting lines) which divides the quadrangular frame 40 into divisions arranged along at least one of the x-axis and the y-axis.

Figure 13:
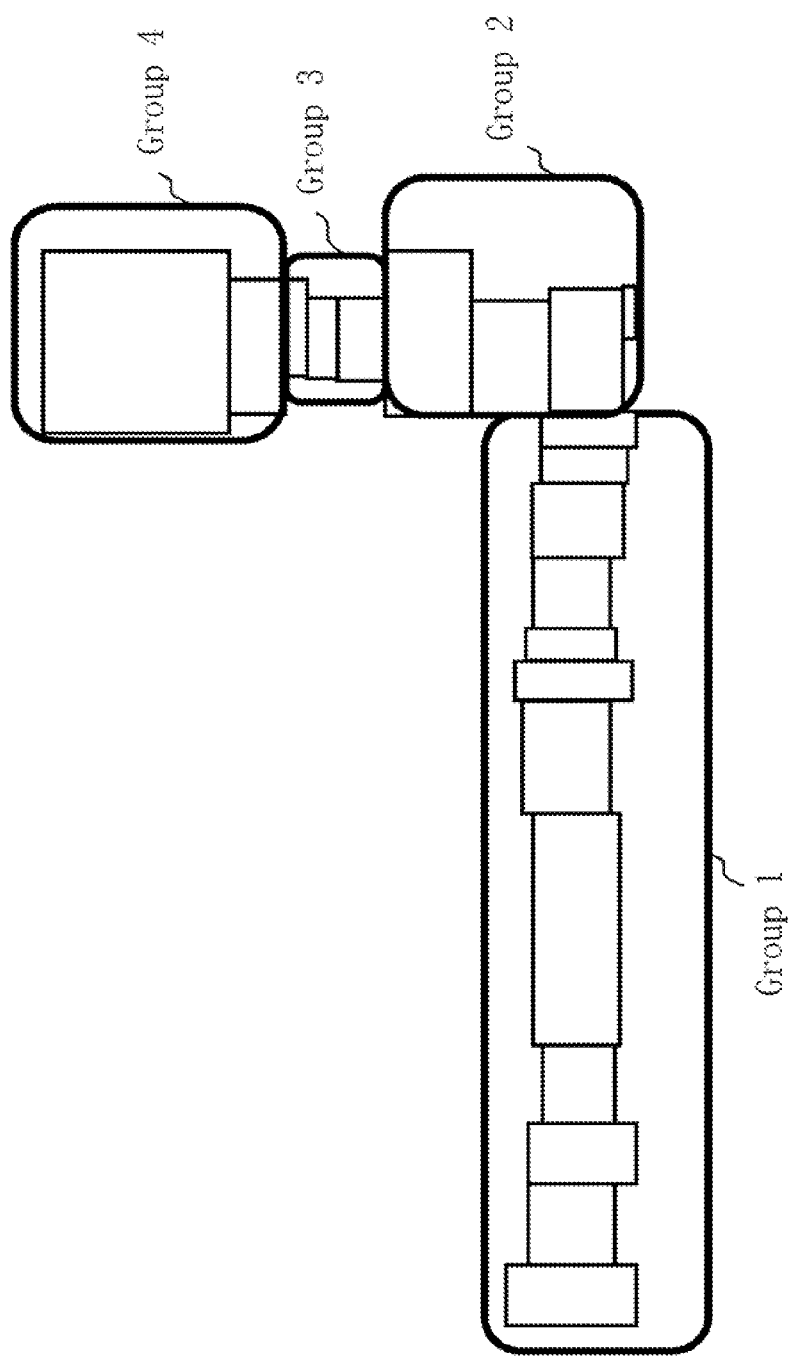
FIG. 13 shows an example of grouping of figure patterns according to the second embodiment.

FIG. 13 shows an example of grouping of figure patterns according to the second embodiment. Although the case in which one group is composed of the entire continuous figure patterns has been described above, it is not limited thereto. It is also preferable to divide the continuous figure patterns into a plurality of groups as shown in FIG. 13. FIG. 13 shows the case where the continuous figure patterns are divided into groups 1 to 4. It is preferable to perform grouping such that each quadrangular frame should not become too large. In the example of FIG. 13, figure patterns are divided at the position where the connection direction changes 90 degrees (where between groups 1 and 2), and at the position where the width size changes greatly (where between groups 2 and 3, and between groups 3 and 4).

Although, in the example described above, one group is composed of a plurality of continuous figure patterns (figure pattern group), it is not limited thereto. One group may be composed of one figure pattern. In that case, when the one figure pattern is a quadrangle, there could be a case where the quadrangular frame and the figure pattern have the same shape. When the one figure pattern is not a quadrangle, such as the case of a triangle, a trapezoid, etc., by setting the quadrangular frame 40, it may be easier to generate a dose (or dose modulation amount (rate)) map. In such a case, particularly, it is preferable to form one group by one figure pattern.

Therefore, in the group processing step described above, the group processing unit 19 reads CAD data defining figure information on at least one figure pattern from the storage device 340, and groups at least one figure pattern defined in the CAD data into at least one group. In the quadrangular frame setting step, the quadrangular frame setting unit 20 inputs figure information on at least one figure pattern, and sets a quadrangular frame which encloses at least one figure pattern. In the writing data generation step, the writing data generation unit 14 generates writing data, based on a data format that sequentially defines figure information on at least one figure pattern, and dose information which is defined before or after the figure information and indicates doses or dose modulation rates for the positions of the four corner points of the quadrangular frame.

As described above, according to the second embodiment, the quadrangular frame 40 is set for each group composed of at least one figure pattern, and a data format defining dose information on doses for the four corner points of the quadrangular frame, intersections each between a parting line and a side, and intersections each between the parting lines is generated. The writing apparatus 100 inputs the generated writing data. Then, in the writing apparatus 100, by using information on a plurality of points defined based on the quadrangular frame 40, the dose (or dose modulation amount (rate)) for a desired position other than the plurality of points is calculated by linear interpolation, etc., for example. The calculation method may be the same as that of the first embodiment.

As described above, according to the second embodiment, dose information can be defined for each group composed of at least one figure pattern. Therefore, it is possible to eliminate the necessity of defining dose information for each minute size. Moreover, it is possible to generate writing data regardless of the correction size of the dose. Therefore, the amount of data can be reduced. Furthermore, according to the second embodiment, since figure information on a plurality of figure patterns and dose information are collectively defined, the amount of data can be further reduced. Moreover, since it is not necessary to generate a dose map even for a region where no figure exists, though for which a dose map is conventionally generated, the amount of data can be reduced from this point of view. Furthermore, although conventionally a dose map is generated even for a region where no figure exists, since according to the second embodiment a dose (or dose modulation amount (rate)) map is generated for each vicinity of a figure group, it is possible to reduce the amount of data even from this point of view. Moreover, since the position of a parting line can be set variably, it is easy to generate grids with variable mesh sizes. Therefore, it becomes easier to generate a more-compressed dose (or dose modulation amount (rate)) map.

Third Embodiment

In the first and second embodiments, there has been described a data format that enables a dose (or dose modulation amount (rate)) to be calculated for a desired position, by using doses (or dose modulation amounts (rates)) for a plurality of points defined based on a figure pattern or a quadrangular frame. However, it is not limited thereto. In the third embodiment, there will be described a configuration where by setting a plurality of mesh regions each having a fixed size in addition to setting a map in which, for example, data for linear interpolation is defined as described in the first and second embodiments, a dose (or dose modulation amount (rate)) is defined for each mesh region. In the third embodiment, the structure of the writing apparatus 100 is the same as that of FIG. 1. The contents of the present embodiment are the same as those of the first or second embodiment other than what is described below.

Figure 14:
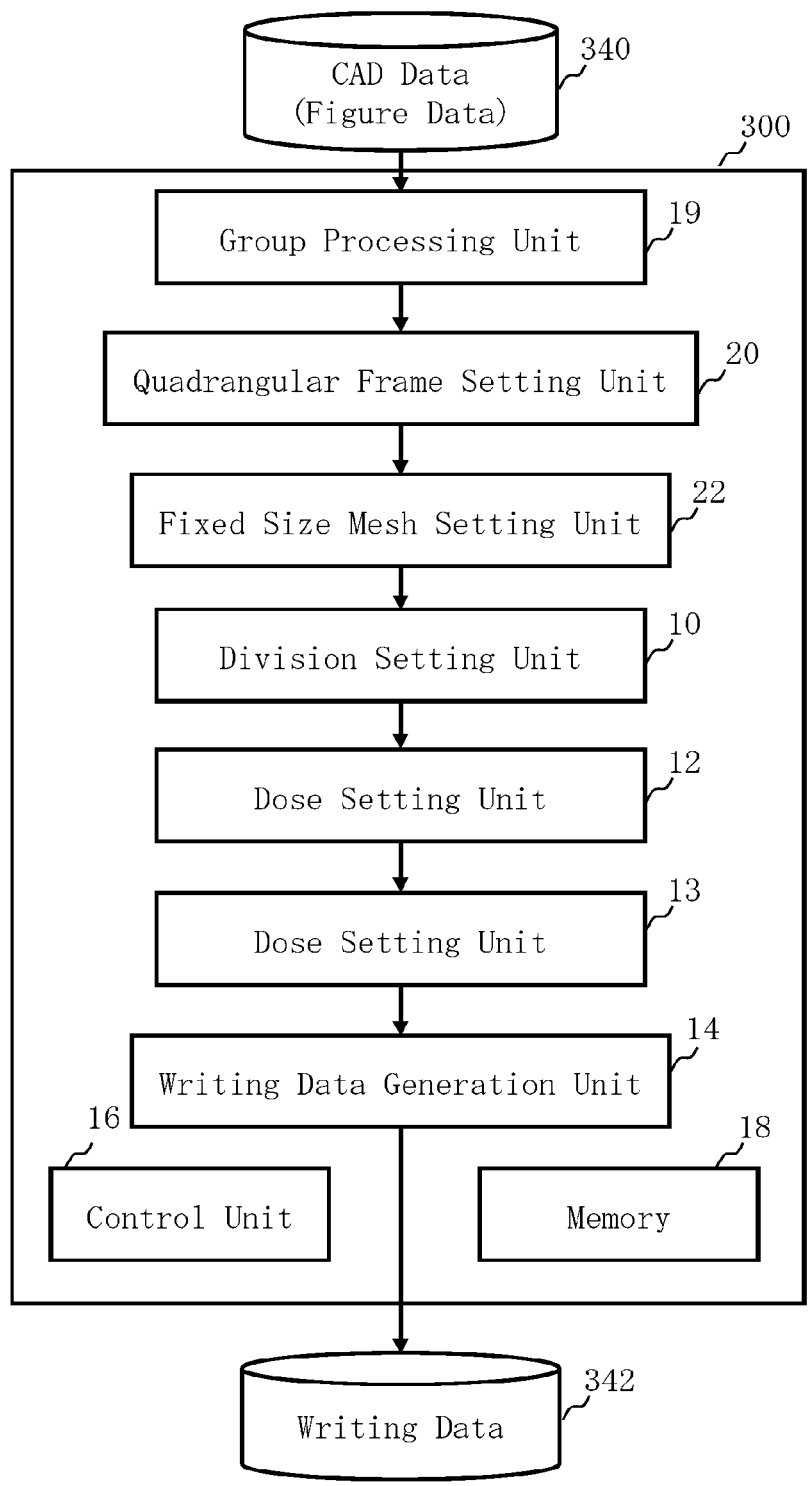
FIG. 14 is a schematic diagram showing a configuration of a writing data conversion device according to a third embodiment.

FIG. 14 is a schematic diagram showing a configuration of a writing data conversion device according to the third embodiment. FIG. 14 is the same as FIG. 10 except that a fixed size mesh setting unit 22 and a dose setting unit 13 are added in the writing data conversion device 300. Each of the "units" such as the division setting unit 10, the dose setting unit 12, the dose setting unit 13, the writing data generation unit 14, the control unit 16, the group processing unit 19, the quadrangular frame setting unit 20, and the fixed size mesh setting unit 22 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the division setting unit 10, the dose setting unit 12, the dose setting unit 13, the writing data generation unit 14, the control unit 16, the group processing unit 19, the quadrangular frame setting unit 20, and the fixed size mesh setting unit 22, and data being operated are stored in the memory 18 each time.

FIG. 14 shows a configuration necessary for explaining the third embodiment. Other configuration elements generally necessary for the writing data conversion device 300 may also be included. Similarly to the first or second embodiment, for example, input devices, such as a mouse and a keyboard, monitoring devices, external interface circuits, etc. maybe connected to the writing data conversion device 300.

The contents of each step from the group processing step to the quadrangular frame setting step are the same as those in the second embodiment. When using, for each figure pattern, the shape of the figure pattern concerned as it is without using a quadrangular frame, each step from the group processing step to the quadrangular frame setting step does not need to be performed, like the first embodiment.

In the fixed size mesh setting step, the fixed size mesh setting unit 22 sets a plurality of mesh regions 44 each having a fixed size in the region outside the quadrangular frame 40 (or one figure pattern 30).

Figure 15:
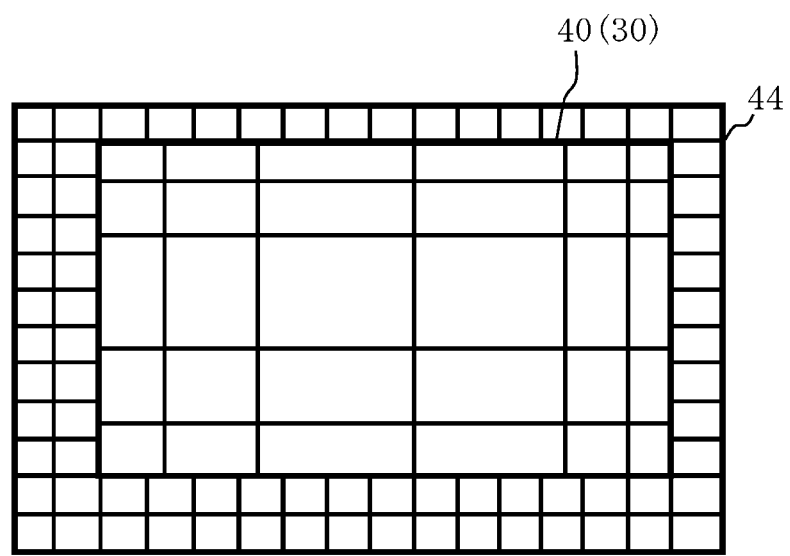
FIG. 15 illustrates an example of a dose definition position according to the third embodiment.

FIG. 15 illustrates an example of a dose definition position according to the third embodiment. As shown in FIG.

15, there are examples of the quadrangular frame 40 (or one figure pattern 30) that encloses figure patterns which are obtained by dividing using parting lines and form one pattern group, and a plurality of mesh regions 44 each having a fixed size outside the quadrangular frame 40 (or one figure pattern 30). A dose (or dose modulation amount (rate)) map is generated by these quadrangular frame 40 (or one figure pattern 30) and a plurality of mesh regions 44.

In the division setting step, the division setting unit 10 sets, for each group (or each figure pattern), an x-direction division number $ndiv_x$ and a y-direction division number $ndiv_y$ of the quadrangular frame 40 (or one figure pattern 30). Moreover, it sets each coordinate for division. When the division number $ndiv_x$=m, x-direction coordinates $x_1$ to $x_m$ (x coordinate for division) are set. When the division number $ndiv_y$=n, y-direction coordinates $y_1$ to $y_n$ (y coordinate for division) are set. When not dividing, the x-direction division number $ndiv_x$ and the y-direction division number $ndiv_y$ should be set to be zero. Alternatively, when not dividing, the division setting step may be omitted. The contents of the dividing method may be the same as those described with reference to FIGS. 4A to 4C, FIGS. 5A and 5B, and FIG. 6. In that case, the figure pattern should be read as the quadangular frame 40.

In the dose setting (1) step, the dose setting unit 12 sets, for each group (or each figure pattern), the dose (or dose modulation amount (rate)) for each of the positions obtained by combining x coordinates $x_0, x_1, \ldots, x_m$, and $x_{m+1}$ including x coordinates $x_0$ and $x_{m+1}$ of the four corner points of the quadrangular frame 40 concerned (or figure pattern 30 concerned), and y coordinates $y_0, y_1, \ldots, y_n$, and $y_{n+1}$ including y coordinates $y_0$ and $y_{n+1}$ of the four corner points thereof. When not dividing, the dose (or dose modulation amount (rate)) for each of the positions of the four corner points should be set.

In the dose setting (2) step, the dose setting unit 13 sets a dose (or dose modulation amount (rate)) for each mesh region 44 of a fixed size. For example, when calculation, such as linear interpolation, is performed using data of a plurality of points that are set in the quadrangular frame 40 (or figure pattern 30 concerned), it is difficult to deal with a local dose change. In such a case, a local dose (or dose modulation amount (rate)) for the mesh region 44 of a fixed size should be set.

In the writing data generation step, the writing data generation unit 14 generates pattern data (writing data), for each group (or each figure pattern), based on a data format that sequentially defines figure information on figure patterns forming the group concerned (or figure information on the figure pattern concerned), and dose information (first dose information) which is defined before or after the figure information and indicates doses (or dose modulation amounts (rates)) for the positions of the four corner points of the quadrangular frame 40 (or figure pattern 30 concerned). In the data format, in addition to dose information on a plurality of points based on the quadrangular frame 40 (or the figure pattern 30 concerned), dose information (second dose information) on a dose (or dose modulation amount (rate)) is sequentially defined for each mesh region 44 of a fixed size. The generated pattern data (writing data) is output to the storage device 342 and stored therein.

The above example describes the case where a plurality of mesh regions 44 are set in the region outside the quadrangular frame 40 which encloses figure patterns forming a group, or the figure pattern 30, but it is not limited thereto.

Figure 16:
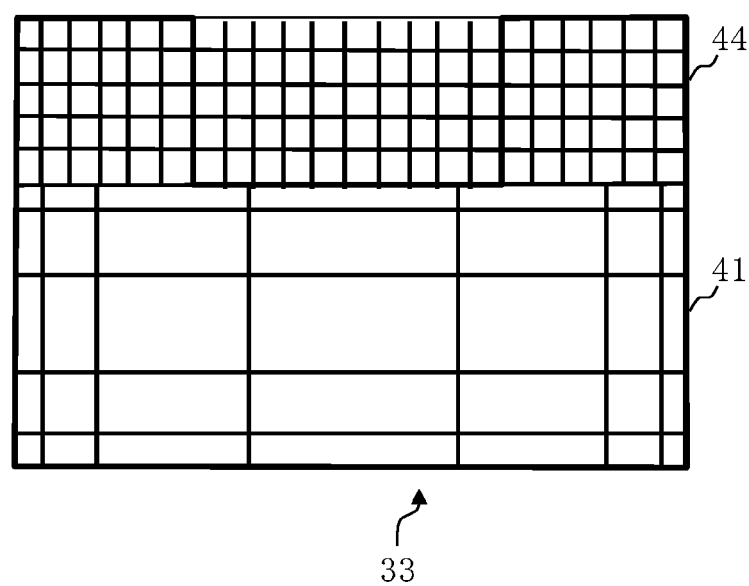
FIG. 16 illustrates another example of the dose definition position according to the third embodiment.

FIG. 16 illustrates another example of the dose definition position according to the third embodiment. As shown in FIG. 16, a quadrangular frame 41 is set in a part of a figure pattern 33. Then, a plurality of mesh regions 44 each having a fixed size are set in the region including the remaining part of the figure pattern 33. The quadrangular frame 41 is divided by the parting lines described above. Doses (or dose modulation amounts (rates)) with respect to the quadrangular frame 41 are set for the four corner points of the quadrangular frame, intersections each between each side and a parting line, and intersections each between the parting lines. It is also preferable to generate a dose (or dose modulation amount (rate)) map for the figure pattern 33 by using the quadrangular frame 40 and a plurality of mesh regions 44. Although, in the example of FIG. 16, one figure pattern 33 is divided into the part of the quadrangular frame and the part of fixed size meshes, it is also preferable to divide a group composed of a plurality of figure patterns into the part of the quadrangular frame and the part of fixed size meshes.

As described above, according to the third embodiment, it is possible to define even a local dose (or dose modulation amount (rate)), such as what is not able to be obtained by functional calculus, such as linear interpolation, for example. Compared with the case where a map is generated based on only a fixed size mesh region, the amount of data can be reduced. For example, with respect to a region for which functional calculus, such as linear interpolation, is sufficiently executed, it is possible to eliminate the necessity of defining dose information for each minute size.

The writing apparatus 100 inputs generated writing data. Then, in the writing apparatus 100, by using information on a plurality of points defined based on the quadrangular frame 40, the dose (or dose modulation amount (rate)) for a desired position other than the plurality of points is calculated by linear interpolation, etc., for example. The calculation method may be the same as that of the first embodiment. If the desired position corresponds to the fixed size mesh region 44, the dose (or dose modulation amount (rate)) defined for the fixed size mesh region 44 can be used.

In multi-beam writing, it is necessary to calculate a dose (or dose modulation amount (rate)) for each pixel. Then, in order to correct dimensional variation resulting from a phenomenon whose influence range is smaller than about 10 μm, it is necessary to define a dose, etc. for each minute size. On the other hand, according to the first, second, or third embodiment, at the stage of writing data input to the multi-beam writing apparatus, it is possible to eliminate the necessity of defining the dose (or dose modulation amount (rate)) for each minute size or each pixel. As described above, the dose (or dose modulation amount (rate)) for a desired pixel region can be calculated by linear interpolation, etc. in the multi-beam writing apparatus by using doses (or dose modulation amounts (rates)) defined for the four corner points of a quadrangular frame (or figure pattern), intersections each between a parting line and a side, and intersections each between the parting lines. Thus, the amount of data, being writing data for multi-beam writing, can be reduced.

Fourth Embodiment

Although, in the first embodiment, there has been described a case where division positions, etc. are set along the direction of the coordinate axis of the orthogonal coordinate system having axes directed in the horizontal x direction and the perpendicular y direction, it is not limited thereto. In the fourth embodiment, there will be described a figure pattern, etc. which is not parallel to the direction of the coordinate axis of the orthogonal coordinate system. The contents of the present embodiment are the same as those of the first embodiment other than what is described below.

Figure 20:
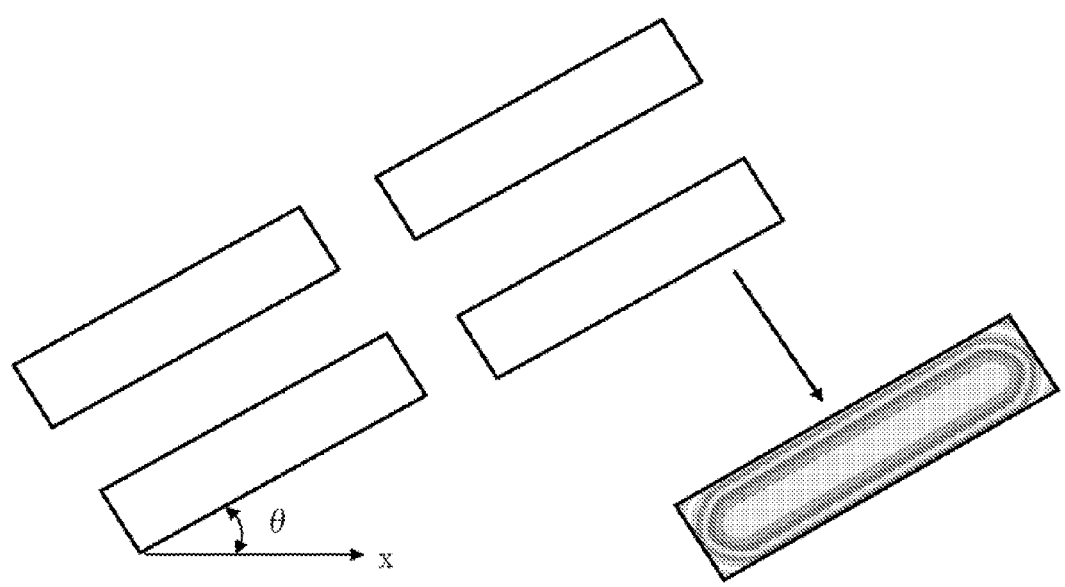
FIG. 20 shows an example of a figure pattern according to a fourth embodiment.

FIG. 20 shows an example of a figure pattern according to the fourth embodiment. FIG. 20 shows a case where a figure pattern rotated against the direction of the coordinate axis of the orthogonal coordinate system directed in the x and y directions is used for a pattern for a memory. With respect to such a figure pattern, it may be difficult to optimally perform data compression by linear interpolation by using a two-dimensional dose map in accordance with the direction of the coordinate axis of the orthogonal coordinate system directed in the x and y directions described above. Then, in the fourth embodiment, there will be described a format that can define writing data of a figure pattern rotated by a rotation angle θ as shown in FIG. 20.

Figure 21:
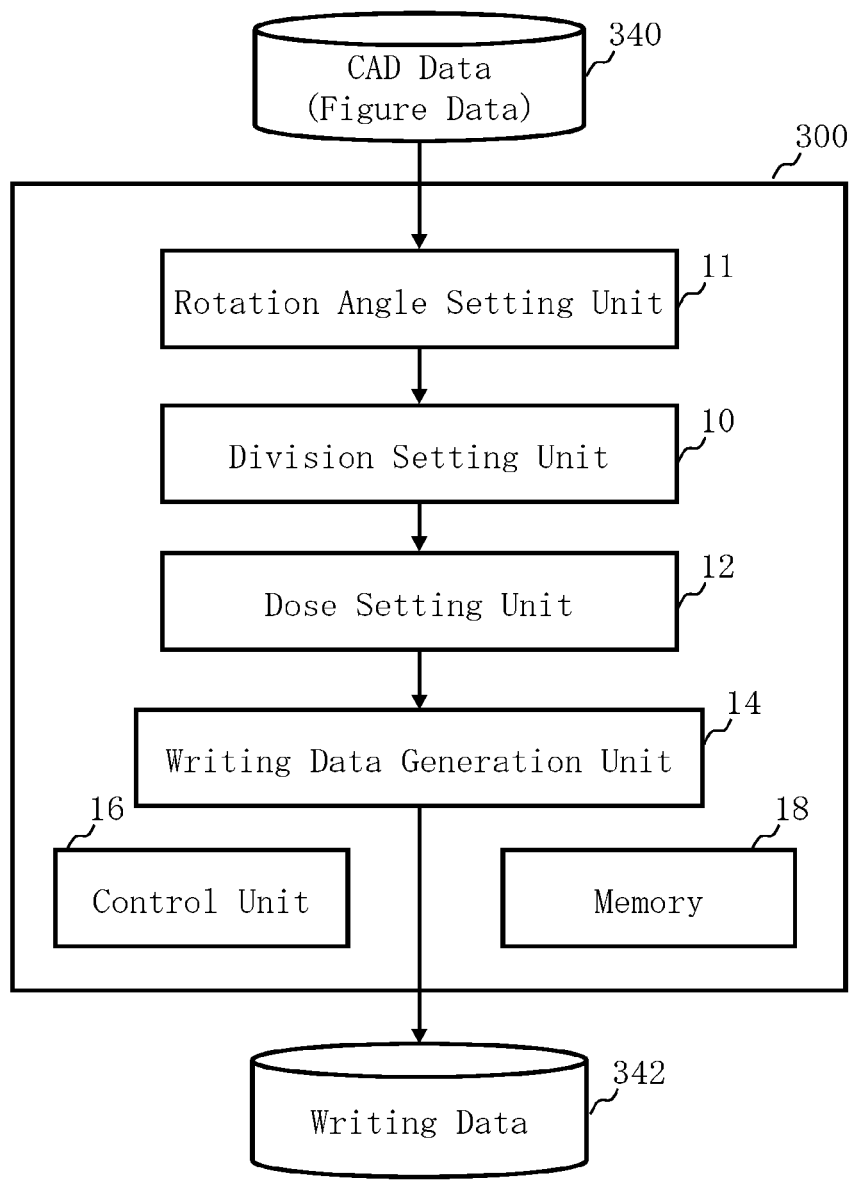
FIG. 21 is a schematic diagram showing a configuration of a writing data conversion device according to the fourth embodiment.

FIG. 21 is a schematic diagram showing a configuration of a writing data conversion device according to the fourth embodiment. FIG. 21 is the same as FIG. 2 except that a rotation angle setting unit 11 is added in the writing data conversion device 300. Each of the "units" such as the rotation angle setting unit 11, the division setting unit 10, the dose setting unit 12, the writing data generation unit 14, and the control unit 16 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the rotation angle setting unit 11, the division setting unit 10, the dose setting unit 12, the writing data generation unit 14, and the control unit 16, and data being operated are stored in the memory 18 each time.

FIG. 21 shows a configuration necessary for explaining the fourth embodiment. Other configuration elements generally necessary for the writing data conversion device 300 may also be included. Similarly to the first embodiment, for example, input devices, such as a mouse and a keyboard, monitoring devices, external interface circuits, etc. may be connected to the writing data conversion device 300.

FIGS. 22A to 22C show an example of a figure pattern with a rotation angle and a data format with a dose modulation amount according to the fourth embodiment. FIG. 22A shows the state where the quadrangular figure pattern 30 is rotated counterclockwise from the x axis by an angle θ. As shown in FIG. 22C, similarly to FIG. 5B, with respect to the x'-y' coordinate system obtained by rotating the x-y coordinate system counterclockwise by the angle θ, the dose (or dose modulation amount (rate)) is defined, in addition to for the four corner points of the quadrangular figure pattern 30, for each intersection between each side of the figure pattern 30 and a parting line which divides the figure pattern 30 into divisions arranged along the x'-axis or y'-axis, and for each intersection between the parting lines. FIG. 22C shows the case where the figure pattern 30 is divided m times in the x' direction and n times in the y' direction. In the example of FIG. 22C, the figure pattern 30 is divided at coordinates $x_1$ to $x_m$ (x coordinate for division) in the x' direction, and at coordinates $y_1$ to $y_n$ (y coordinate for division) in the y' direction. When defining the coordinates of the corner point at the lower left of the figure pattern 30 to be $(x_0, y_0)$, the x coordinate of each position for which the dose (or dose modulation amount (rate)) is defined is $x_0$, $x_1$, ..., $x_m$, or $x_{m+1}$ in order in the x' direction, and the y coordinate of each position is $y_0$, $y_1$, ..., $y_n$, or $y_{n+1}$ in order in the y' direction. Therefore, indices are represented by combination of values 0, 1, ..., m, or m+1 in order in the x' direction, and 0, 1, ..., n, or n+1 in order in the y' direction.

The data format shown in FIG. 22B defines 1-byte expression code ($code_{ROT}$) indicating being a rotation angle, 4-byte figure pattern rotation angle θ, 1-byte expression code ($code_{DD}$) indicating being a dose (or dose modulation amount (rate)), 2-byte figure pattern x'-direction division number $ndiv_x$, 2-byte figure pattern y'-direction division number $ndiv_y$, 3-byte division x-coordinates $x_1$ to $x_m$, 3-byte division y-coordinates $y_1$ to $y_n$, and doses (or dose modulation amounts (rates)) $d_{00}$, $d_{10}$, $d_{20}$, $d_{m0}$, $d_{(m+1)0}$, ..., $d_{0(n+1)}$, $d_{1(n+1)}$, $d_{2(n-1)}$, $d_{m(n+1)}$, and $d_{(m-1)(n+1)}$ for the positions of the four corner points of the figure pattern 30, intersections each between each side of the figure pattern 30 and a parting line which divides the figure pattern 30 into divisions arranged along the x'-axis or the y'-axis, and intersections each between the parting lines. Then, following the dose information (data), 1-byte figure type code ($code_{FIG}$) indicating a figure type, 3-byte figure pattern (x) coordinate, 3-byte figure pattern (y) coordinate, 2-byte x'-direction size w, and 2-byte y'-direction size h are defined. As for an actual coordinate value, not values in the x'-y' coordinate system, but values in the x-y coordinate system which is not rotated by the angle θ are defined.

The 1-byte expression code ($code_{ROT}$) indicating being a rotation angle, the 4-byte figure pattern rotation angle θ, the 1-byte figure type code ($code_{FIG}$) indicating a figure type, the 3-byte figure pattern (x) coordinate, the 3-byte figure pattern (y) coordinate, the 2-byte x'-direction size w, and the 2-byte y'-direction size h indicate figure information on a figure pattern. The expression code ($code_{DD}$), the division number $ndiv_x$, the division number $ndiv_y$, the division x-coordinates $x_1$ to $x_m$, the division y-coordinates $y_1$ to $y_n$, and the doses (or dose modulation amounts (rates)) $d_{00}$, $d_{10}$, $d_{20}$, $d_{m0}$, $d_{(m+1)0}$, ..., $d_{0(n+1)}$, $d_{1(n+1)}$, $d_{2(n+1)}$, $d_{m(n+1)}$, and $d_{(m+1)(n+1)}$ for the positions of the four corner points, intersections each between each side of the figure pattern 30 and a parting line, and intersections each between the parting lines indicate dose information. The dose information may be defined after the figure information on a figure pattern. Therefore, the data format for x'-direction m-times division and y'-direction n-times division shown in FIG. 22A defines each quadrangular pattern by 1+4+1+2×2+3×(m+n)+2×(m+2)(n+2)+1+3×2+2×2=(29+2mn+7m+7n) bytes.

The method for generating writing data of the data format described above executes a rotation angle setting step, a division setting step, a dose setting step, and a writing data generation step.

In the rotation angle setting step, the rotation angle setting unit 11 reads CAD data from the storage device 340, and sets a rotation angle θ of a figure pattern for each figure pattern.

In the division setting step, the division setting unit 10 reads CAD data from the storage device 340, converts, for each figure pattern, according to a set rotation angle θ, the x-y coordinate system into an x'-y' coordinate system by rotating the x-y coordinate system counterclockwise by the set rotation angle θ, and sets an x'-direction division number $ndiv_x$ and a y'-direction division number $ndiv_y$. Moreover, it sets each coordinate for division. When the division number $ndiv_x$=m, it sets x-direction coordinates $x_1$ to $x_m$ (x coordinate for division) obtained by converting an x' coordinate in the x'-y' coordinate system to an x coordinate in the x-y coordinate system. When the division number $ndiv_y$=n, it sets y-direction coordinates $y_1$ to $y_n$ (y coordinate for division) obtained by converting a y' coordinate in the x'-y' coordinate system to a y coordinate in the x-y coordinate system. When not dividing, the x-direction division number $ndiv_x$ and the y-direction division number $ndiv_y$ should be set to be zero. Alternatively, when not dividing, the division setting step may be omitted.

In the dose setting step, the dose setting unit 12 sets, for each figure pattern, the dose (or dose modulation amount (rate)) for each of the positions obtained by combining x coordinates $x_0, x_1, \ldots, x_m$, and $x_{m+1}$ including x coordinates $x_0$ and $x_{m-1}$ of the four corner points of the figure pattern concerned, and y coordinates $y_0, y_1, \ldots, y_n$, and $y_{n+1}$ including y coordinates $y_0$ and $y_{n+1}$ of the four corner points thereof. When not dividing, the dose (or dose modulation amount (rate)) for each of the positions of the four corner points should be set.

In the writing data generation step, the writing data generation unit 14 generates pattern data (writing data), for each figure pattern, based on a data format that sequentially defines rotation information, being a part of figure information on the figure pattern concerned, which indicates a rotation angle of the figure pattern concerned, the figure information, being other than the rotation information, on the figure pattern concerned, and dose information that is defined before or after the figure information other than the rotation information and indicates doses (or dose modulation amounts (rates)) for the positions described above including the four corner points. Although, in the example of FIG. 22B, the expression code ($code_{ROT}$) and the rotation angle θ, which show rotation information, are separated from the other figure information in a manner such that they are defined before the dose information, it is not limited thereto. It is also preferable to define the rotation information to be continuous with the other figure information and to be before or after the dose information.

The control unit 16 outputs writing data composed collectively of generated pattern data of each figure pattern to the storage device 342 and stores it therein. Thus, the writing data to be input to the writing apparatus 100 which writes a figure pattern on the target object 101 with the electron beam 200 is generated.

In the dose calculation step according to the fourth embodiment, first, the dose calculation unit 113 obtains coordinates (x', y') by converting, by using a rotation angle θ, the coordinates of the position (x, y) for which a dose (or dose modulation amount (rate)) has been set into the x'-y' coordinate system which is obtained by rotating the x-y coordinate system counterclockwise by the rotation angle θ. Then, it calculates a dose (or dose modulation amount (rate)) d(x', y') for a desired position (x', y') by using dose information defined in the writing data. The calculation method for the dose (or dose modulation amount (rate)) d(x', y') is reading the coordinates (x, y) in the equation (1) as coordinates (x', y') and performing, for example, linear interpolation similar to that applied in the equation (1). Then, after the calculation, the coordinates (x', y') of d(x', y') should be converted to coordinates (x, y).

Although, in the example described above, the position for which a dose (or dose modulation amount (rate)) has been set is defined by the position (x, y) having been converted into the x-y coordinate system that is not rotated by the rotation angle θ, it is not limited thereto. It is also preferable to perform defining by using coordinates (x', y') in the x'-y' coordinate system obtained by rotating the x-y coordinate system counterclockwise by the rotation angle θ. In that case, calculation should be performed by reading the coordinates (x, y) in the equation (1) as coordinates (x', y') in the dose calculation step, and performing, for example, linear interpolation similar to that applied in the first embodiment. Then, after the calculation, the coordinates (x', y') of d(x', y') should be converted to coordinates (x, y).

As described above, according to the fourth embodiment, the same effect as that of the first embodiment can be acquired. Furthermore, it is possible to eliminate the necessity of defining dose information for each minute size even when the figure pattern is rotated.

Fifth Embodiment

Although, in the second embodiment, there has been described a case where division positions, etc. of the quadrangular frame 40 are set along the direction of the coordinate axis of the orthogonal coordinate system having axes directed in the horizontal x direction and the perpendicular y direction, it is not limited thereto. In the fifth embodiment, there will be described a group composed of at least one figure pattern which is not parallel to the direction of the coordinate axis of the orthogonal coordinate system. The contents of the present embodiment are the same as those of the second embodiment other than what is described below.

Figure 23:
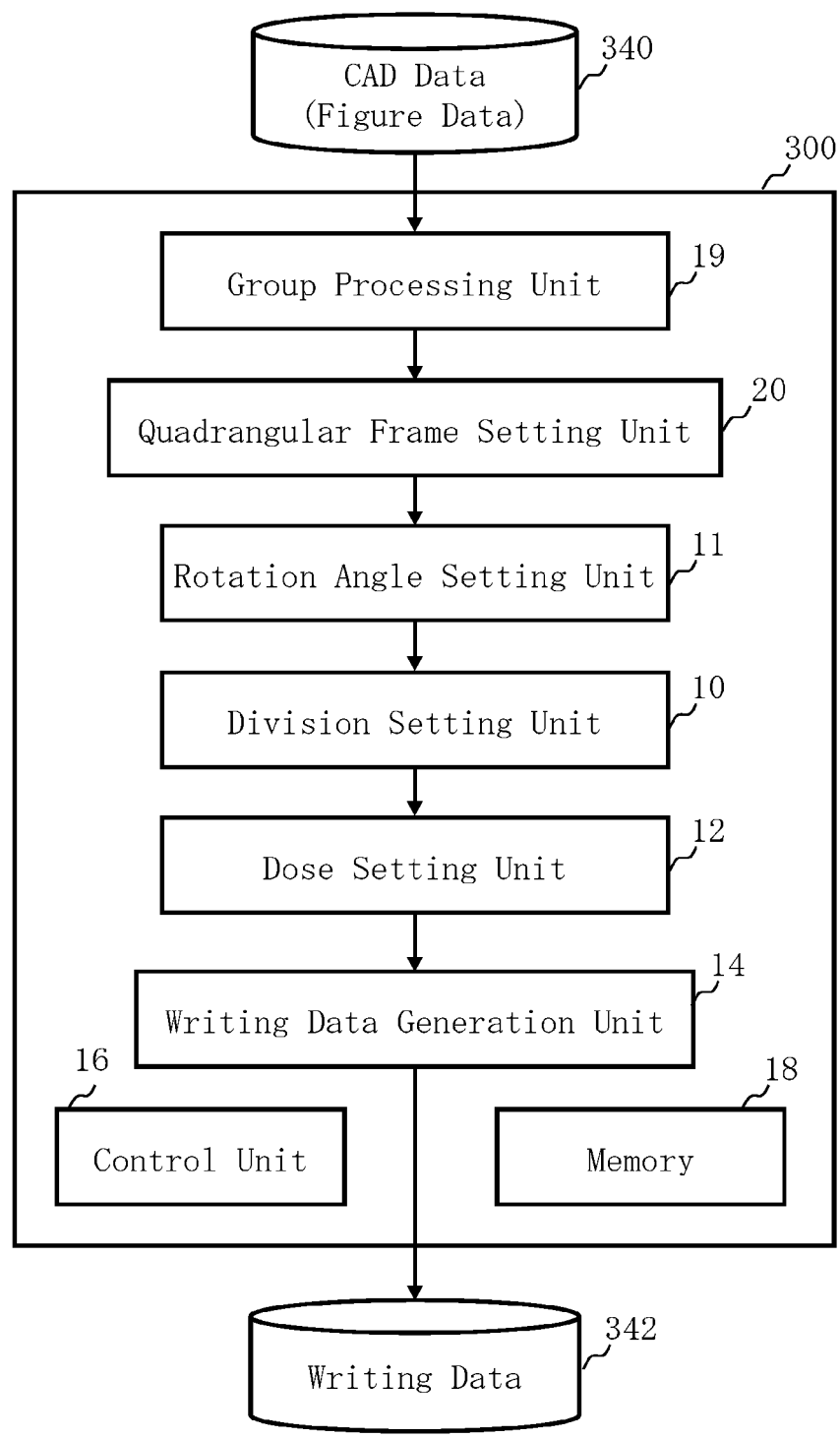
FIG. 23 is a schematic diagram showing a configuration of a writing data conversion device according to a fifth embodiment.

FIG. 23 is a schematic diagram showing a configuration of a writing data conversion device according to the fifth embodiment. FIG. 23 is the same as FIG. 10 except that the rotation angle setting unit 11 is added in the writing data conversion device 300. Each of the "units" such as the rotation angle setting unit 11, the division setting unit 10, the dose setting unit 12, the writing data generation unit 14, the control unit 16, the group processing unit 19 and the quadrangular frame setting unit 20 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the rotation angle setting unit 11, the division setting unit 10, the dose setting unit 12, the writing data generation unit 14, the control unit 16, the group processing unit 19, and the quadrangular frame setting unit 20, and data being operated are stored in the memory 18 each time.

FIG. 23 shows a configuration necessary for explaining the fifth embodiment. Other configuration elements generally necessary for the writing data conversion device 300 may also be included. Similarly to the second embodiment, for example, input devices, such as a mouse and a keyboard, monitoring devices, external interface circuits, etc. may be connected to the writing data conversion device 300.

Figures 24A, 24B, 24C:
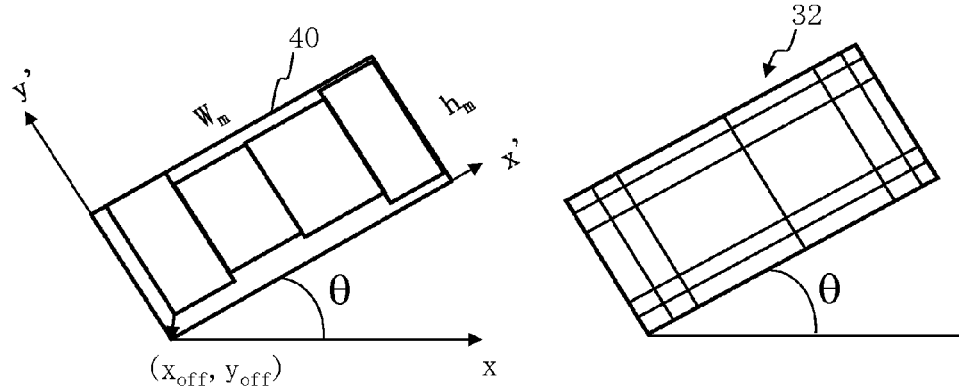
FIGS. 24A to 24C illustrate an example of a figure pattern group, a dose definition position, and a data format with a dose modulation amount according to the fifth embodiment.

FIGS. 24A to 24C illustrate an example of a figure pattern group, a dose definition position, and a data format with a dose modulation amount according to the fifth embodiment. FIG. 24A shows an example of continuously connected figure patterns. The example of FIG. 24A shows the same configuration as that obtained by rotating the continuously connected figure patterns shown in FIG. 11C by the angle θ. According to the fifth embodiment, regarding the continuously connected figure patterns as one group, a dose (or dose modulation amount (rate)) map is generated for each group.

In the group processing step, the group processing unit 19 reads CAD data defining figure information on a plurality of figure patterns from the storage device 340, and performs grouping of a plurality of figure patterns defined in the CAD data into at least one group composed of continuous figure patterns. When there is only one combination of continuous figure patterns, only one group is formed. For example, grouping is performed regarding one combination of continuous figure patterns shown in FIG. 24A as one group.

In the quadrangular frame setting step, the quadrangular frame setting unit 20 sets, for each group, a quadrangular frame which encloses figure patterns in the group concerned. The quadrangular frame is preferably a circumscribed quadrangle enclosing figure patterns, for example. However, it is not limited thereto, and, as shown in FIG. 24A, the quadrangular frame 40 may be a little larger than the circumscribed quadrangle. For example, in the case of setting a parting line, to be described later, in accordance with a predetermined grid, the quadrangular frame 40 itself may be set in accordance with the grid. According to the fifth embodiment similarly to the second embodiment, the quadrangular frame 40 is used as the dose (or dose modulation amount (rate)) map 32 as shown in FIG. 24B. The quadrangular frame setting unit 20 defines the quadrangular frame 40 (map) to have an x'-direction size $w_m$, and a y'-direction size $h_m$. Moreover, the quadrangular frame setting unit 20 defines an offset amount ($x_{off}$, $y_{off}$) from the reference position (e.g., lower left corner) of the first (e.g., left end) figure pattern in the figure patterns of the group concerned enclosed by the quadrangular frame 40 to the reference position (e.g., lower left corner) of the quadrangular frame 40 (map).

In the rotation angle setting step, after the quadrangular frame 40 has been set, the rotation angle setting unit 11 set a rotation angle θ of the quadrangular frame 40. Therefore, the pattern data (writing data) of the figure patterns enclosed by the quadrangular frame 40 shown in FIG. 24A defines figure information on the figure patterns, dose information using the quadrangular frame 40 as the dose (or dose modulation amount (rate)) map 32, and the rotation angle θ.

In the division setting step, the division setting unit 10 converts, for each group, according to a set rotation angle θ, the x-y coordinate system into an x'-y' coordinate system by rotating the x-y coordinate system counterclockwise by the set rotation angle θ, and sets an x'-direction division number $ndiv_x$ and a y'-direction division number $ndiv_y$ of the quadrangular frame 40. Moreover, it sets each coordinate for division. When the division number $ndiv_x$=m, it sets x-direction coordinates $x_1$ to $x_m$ (x coordinate for division) obtained by converting an x' coordinate in the x'-y' coordinate system to an x coordinate in the x-y coordinate system. When the division number $ndiv_y$=n, it sets y-direction coordinates $y_1$ to $y_n$ (y coordinate for division) obtained by converting a y' coordinate in the x'-y' coordinate system to a y coordinate in the x-y coordinate system. When not dividing, the x-direction division number $ndiv_x$ and the y-direction division number $ndiv_y$ should be set to be zero. Alternatively, when not dividing, the division setting step may be omitted. The contents of the dividing method may be the same as those described with reference to FIGS. 4A to 4C, FIGS. 5A and 5B, and FIG. 6. In that case, the figure pattern should be read as the quadrangular frame 40.

In the dose setting step, the dose setting unit 12 sets, for each group, the dose (or dose modulation amount (rate)) for each of the positions obtained by combining x coordinates $x_0, x_1, \ldots, x_m$, and $x_{m+1}$ including x coordinates $x_0$ and $x_{m+1}$ of the four corner points of the quadrangular frame 40 concerned, and y coordinates $y_0, y_1, \ldots, y_n$, and $y_{n+1}$ including y coordinates $y_0$ and $y_{n+1}$ of the four corner points thereof. When not dividing, the dose (or dose modulation amount (rate)) for each of the positions of the four corner points should be set.

In the example of FIG. 24C, similarly to FIG. 12, there are defined doses (or dose modulation amounts (rates)) for the positions of the four corner points of the quadrangular frame 40, intersections each between each side of the quadrangular frame 40 and a parting line which divides the quadrangular frame 40 into divisions arranged along the x-axis or the y-axis, and intersections each between the parting lines. The data format with the dose modulation amount shown in FIG. 24C is the same as that of FIG. 12 except that the expression code ($code_{ROT}$) and the rotation angle θ indicating rotation information are added.

In the writing data generation step, the writing data generation unit 14 generates pattern data (writing data), for each group, based on a data format that sequentially defines rotation information, being a part of figure information on figure patterns forming the group concerned, which indicates a rotation angle of the figure patterns, the figure information, being other than the rotation information, on the figure patterns forming the group concerned, and dose information which is defined before or after the figure information and indicates doses (or dose modulation amounts (rates)) for the positions of the four corner points of the quadrangular frame 40. Although, in the example of FIG. 24C, the expression code ($code_{ROT}$) and the rotation angle θ, which show rotation information, are separated from the other figure information in a manner such that they are defined before the dose information, it is not limited thereto. It is also preferable to define the rotation information to be continuous with the other figure information and to be before or after the dose information. The generated pattern data (writing data) is output to the storage device 342 and stored therein.

As described above, according to the fifth embodiment, with respect to one quadrangular pattern (group: continuously connected figure patterns), 1-byte expression code ($code_{ROT}$) indicating being a rotation angle and 4-byte rotation angle θ of a figure pattern are added to the configuration of FIG. 12. Therefore, the data format for x-direction m-times division and y-direction n-times division shown in FIG. 24C can be defined by $1+4+1+2\times2+3\times2+2\times2+3\times(m+n)+2\times(m+2)(n+2)+1+1+2+N\cdot(3\times2+2\times2) = (32+2mn+7m+7n+10)$ bytes.

In the dose calculation step according to the fifth embodiment, first, the dose calculation unit 113 obtains coordinates (x', y') by converting, by using a rotation angle θ, the coordinates of the position (x, y) for which a dose (or dose modulation amount (rate)) has been set into the x'-y' coordinate system which is obtained by rotating the x-y coordinate system counterclockwise by the rotation angle θ. Then, it calculates a dose (or dose modulation amount (rate)) d(x', y') for a desired position (x', y') by using dose information defined in the writing data. The calculation method for the dose (or dose modulation amount (rate)) d(x', y') is reading the coordinates (x, y) in the equation (1) as coordinates (x', y') and performing, for example, linear interpolation similar to that applied in the equation (1). Then, after the calculation, the coordinates (x', y') of d(x', y') should be converted to coordinates (x, y).

Although, in the example described above, the position for which a dose (or dose modulation amount (rate)) has been set is defined by the position (x, y) having been converted into the x-y coordinate system that is not rotated by the rotation angle θ, it is not limited thereto. It is also preferable to perform defining by using coordinates (x', y') in the x'-y' coordinate system obtained by rotating the x-y coordinate system counterclockwise by the rotation angle θ. In that case, calculation should be performed by reading the coordinates (x, y) in the equation (1) as coordinates (x', y') in the dose calculation step, and performing, for example, linear interpolation similar to that applied in the second embodiment. Then, after the calculation, the coordinates (x', y') of d(x', y') should be converted to coordinates (x, y).

As described above, according to the fifth embodiment, the same effect as that of the second embodiment can be acquired. Furthermore, it is possible to eliminate the necessity of defining dose information for each minute size even when the figure patterns (group) are rotated.

Sixth Embodiment

Although, in the second embodiment, there has been described a case in which a dose (or dose modulation amount (rate)) map is generated regarding figure patterns connected continuously and enclosed by the quadrangular frame 40 as one group, it is not limited thereto. According to the sixth embodiment, with respect to each cell composed of at least one combination of continuously connected figure patterns (group), a dose (or dose modulation amount (rate)) map is generated for each combination of figure patterns (group) in the cell concerned. Moreover, for each cell, there is generated writing data of a data format that defines dose information indicating a dose (or dose modulation amount (rate)) for each combination of figure patterns included in the cell concerned. The contents of the present embodiment are the same as those of the second embodiment other than what is described below.

Figure 25:
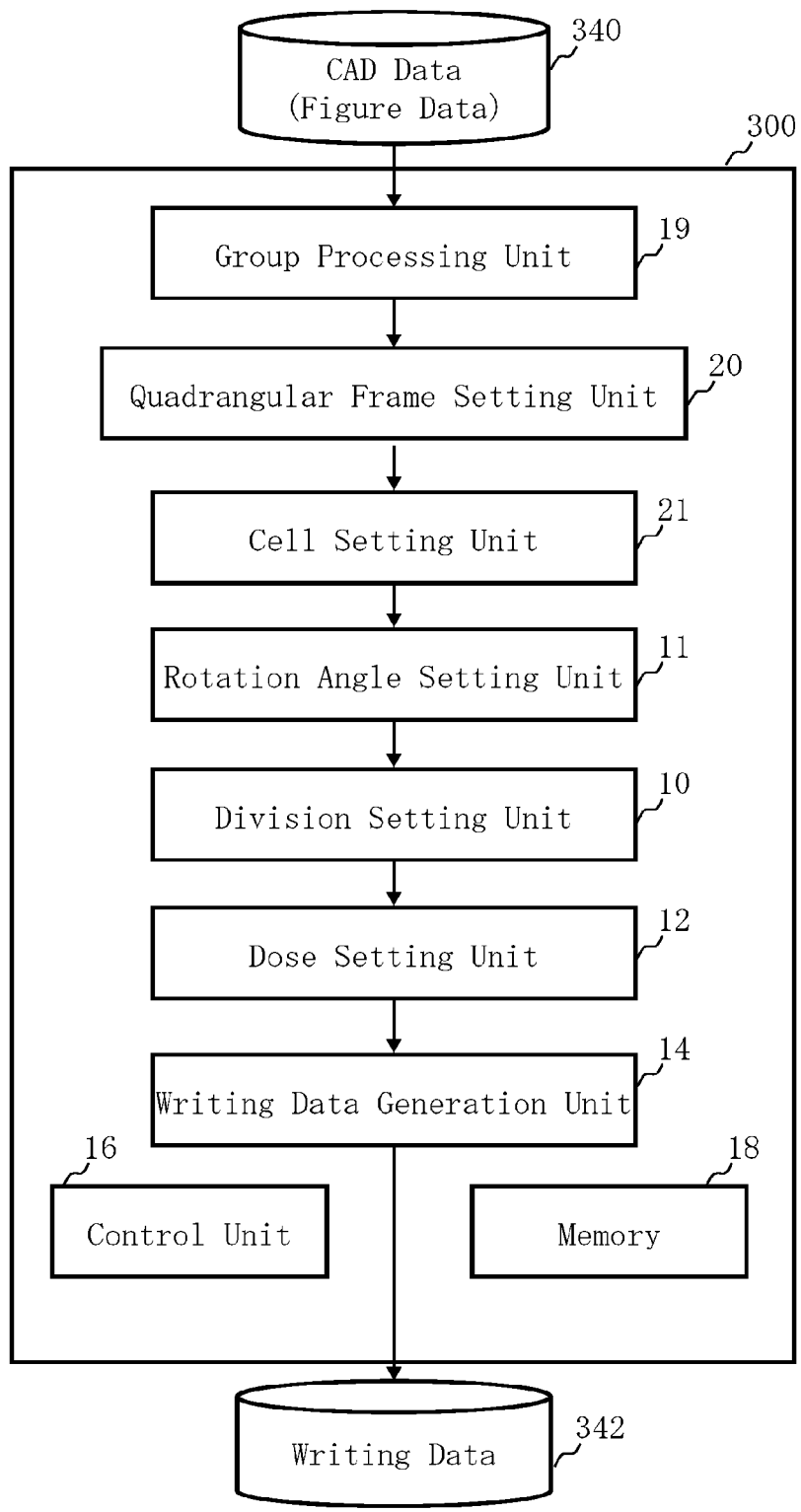
FIG. 25 is a schematic diagram showing a configuration of a writing data conversion device according to a sixth embodiment.

FIG. 25 is a schematic diagram showing a configuration of a writing data conversion device according to the sixth embodiment. FIG. 25 is the same as FIG. 10 except that a cell setting unit 21 and the rotation angle setting unit 11 are added in the writing data conversion device 300. Each of the "units" such as the cell setting unit 21, the rotation angle setting unit 11, the division setting unit 10, the dose setting unit 12, the writing data generation unit 14, the control unit 16, the group processing unit 19, and the quadrangular frame setting unit 20 includes a processing circuitry. The processing circuitry includes an electric circuit, a quantum circuit, a computer, a processor, a circuit board, or a semiconductor device, for example. The processing circuitry of the each of the "units" may use the common processing circuitry (same processing circuitry), or may use different processing circuitries (separated processing circuitries). Data which is input and output to/from the cell setting unit 21, the rotation angle setting unit 11, the division setting unit 10, the dose setting unit 12, the writing data generation unit 14, the control unit 16, the group processing unit 19, and the quadrangular frame setting unit 20, and data being operated are stored in the memory 18 each time.

FIG. 25 shows a configuration necessary for explaining the sixth embodiment. Other configuration elements generally necessary for the writing data conversion device 300 may also be included. Similarly to the second embodiment, for example, input devices, such as a mouse and a keyboard, monitoring devices, external interface circuits, etc. may be connected to the writing data conversion device 300.

Figure 26:
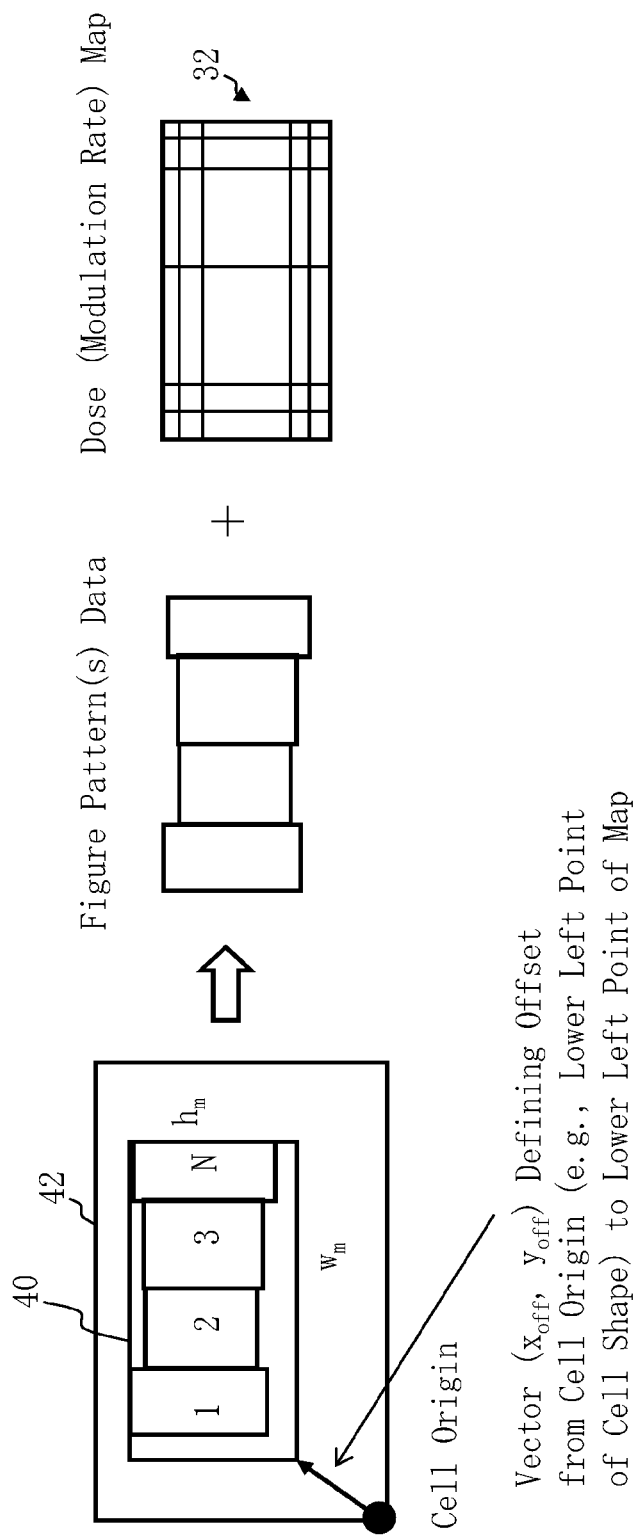
FIG. 26 illustrates an example of a cell, a figure pattern group and a dose definition position according to the sixth embodiment.

FIG. 26 illustrates an example of a cell, a figure pattern group and a dose definition position according to the sixth embodiment. FIG. 26 shows an example of a group composed of continuously connected figure patterns. In the example of FIG. 26, one combination of continuously connected figure patterns shown in FIG. 11C is enclosed, as one group, by the quadrangular frame 40, and the group is included in a cell 42. According to the sixth embodiment, the dose (or dose modulation amount (rate)) map 32 for the group in the cell 42 is generated for each cell which includes such a group (and quadrangular frame 40 enclosing the group).

In the example of FIG. 26, since the quadrangular frame 40 is set along the direction of the coordinate axis of the orthogonal coordinate system having axes directed in the horizontal x direction and the perpendicular y direction, rotation information is not necessarily required. Therefore, when generating writing data with respect to the example of FIG. 26, the rotation angle setting unit 11 shown in FIG. 25 may be omitted.

The contents of the group processing step and the quadrangular frame setting step are the same as those described in the second embodiment. However, the quadrangular frame setting unit 20 does not need to define the offset amount ($x_{off}$, $y_{off}$).

In the cell setting step, after the quadrangular frame 40 has been set, the cell setting unit 21 sets the cell 42 (cell region) including the whole figure enclosed by the quadrangular frame 40. The cell 42 is preferably a quadrangle. An offset amount from the origin of the cell region to the origin of the quadrangular frame is defined. Specifically, the cell setting unit 21 defines an offset amount ($x_{off}$, $y_{off}$) from the reference position (e.g., lower left corner) of the quadrangular frame 40 concerned enclosed by the cell 42 to the reference position (e.g., lower left corner) of the cell 42 (map). Therefore, pattern data (writing data) of figure patterns in the cell 42 defines, for each quadrangular frame 40 (group in a cell), figure information on the figure patterns and dose information which regards the quadrangular frame 40 as the dose (or dose modulation amount (rate)) map 32.

In the division setting step, the division setting unit 10 sets, for each quadrangular frame 40 in each cell 42, an x-direction division number $ndiv_x$ and a y-direction division number $ndiv_y$ of the quadrangular frame 40. Moreover, it sets each coordinate for division. The contents of the subsequent division setting step are the same as those of the second embodiment. Moreover, the contents of the dose setting step are the same as those of the second embodiment.

FIG. 27 shows an example of a data format with a dose modulation amount according to the sixth embodiment. The data format shown in FIG. 27 is the same as that of FIG. 12 except that 1-byte expression code ($code_{Cellstart}$) indicating being in the same cell is added at the beginning, 3-byte offset amount $x_{off}$ indicates an offset amount between the quadrangular frame 40 and the cell 42, instead of the offset amount between a figure pattern group concerned and the quadrangular frame 40, 3-byte offset amount $y_{off}$ indicates an offset amount between the quadrangular frame 40 and the cell 42, instead of the offset amount between a figure pattern group and the quadrangular frame 40, 1-byte expression code ($code_{Cellend}$) indicating being the last in the same cell is added at the end, and, with respect to each of figure patterns 1 to N forming a figure pattern group in the same cell, 1-byte expression code ($code_{FIG}$) is added at the beginning, for each group composed of 3-byte figure pattern (X) coordinate, 3-byte figure pattern (Y) coordinate, 2-byte x-direction size W, and 2-byte y-direction size H.

In the writing data generation step, the writing data generation unit 14 generates pattern data (writing data), for each cell, based on a data format that sequentially defines figure information on figure patterns forming the cell concerned, and dose information which is defined before or after the figure information and indicates doses (or dose modulation amounts (rates)) for the positions of the four corner points of the quadrangular frame 40. The generated pattern data (writing data) is output to the storage device 342 and stored therein.

Therefore, the data format shown in FIG. 27C, where one group is arranged in a cell, and the group is divided in the x direction m-times and in the y direction n-times, can be defined by $1+1+2\times2+3\times2+2\times2+3\times(m+n)+2\times(m+2)(n+2)+N\cdot(1+3\times2+2\times2)+1=(25+2mn+7m+7n+11N)$ bytes.

As described above, according to the sixth embodiment, dose information can be defined for each cell in which a group composed of at least one figure pattern is arranged. Moreover, the same effects as those of the second embodiment can be achieved.

Seventh Embodiment

Although, in the sixth embodiment, there has been described a case where the cell 42 is set along the direction of the coordinate axis of the orthogonal coordinate system having axes directed in the horizontal x direction and the perpendicular y direction, it is not limited thereto. In the seventh embodiment, there will be described a case where a cell not being parallel to the direction of the coordinate axis of the orthogonal coordinate system is set. The configuration of the writing data conversion device 300 is the same as that of FIG. 25. The contents of the present embodiment are the same as those of the sixth embodiment other than what is described below.

Figures 28A, 28B:
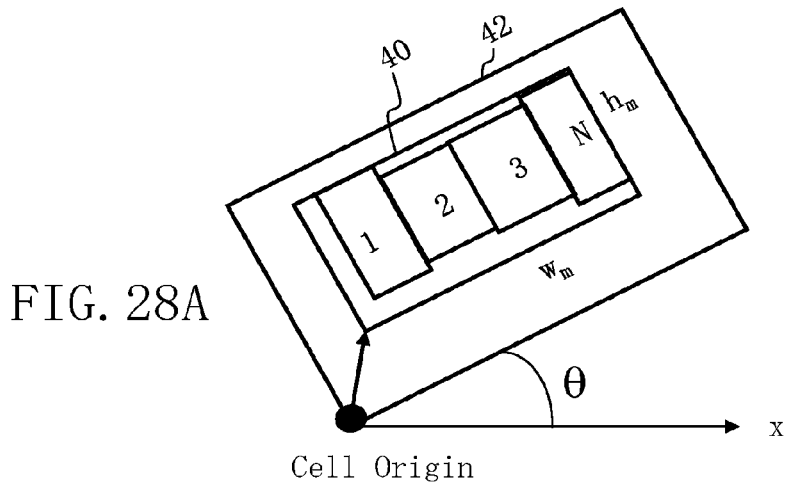
FIGS. 28A and 28B illustrate an example of a cell, a figure pattern group, and a data format with a dose modulation amount according to a seventh embodiment.

FIGS. 28A and 28B illustrate an example of a cell, a figure pattern group, and a data format with a dose modulation amount according to the seventh embodiment. FIG. 28A shows the configuration where the cell 42, the quadrangular frame 40 in the cell 42, and figure patterns enclosed by the quadrangular frame 40 shown in FIG. 26 are rotated by the angle θ. According to the seventh embodiment, a dose (or dose modulation amount (rate)) map is generated for each cell 42.

The group processing step and the quadrangular frame setting step are carried out. The contents of the group processing step and the quadrangular frame setting step are the same as those of the sixth embodiment (the second embodiment). Next, the cell setting step is carried out. The contents of the cell setting step are the same as those of the sixth embodiment. The cell 42 is set by using a quadrangle rotated by the rotation angle being the same as that used for rotating the quadrangular frame 40 in the cell.

In the rotation angle setting step, after the cell 42 has been set, the rotation angle setting unit 11 set a rotation angle θ of the cell 42. Therefore, the pattern data (writing data) of the figure patterns in the cell 42 shown in FIG. 28A defines figure information on the figure patterns, dose information on the dose (or dose modulation amount (rate)) map 32 using the quadrangular frame 40, and the rotation angle θ of the cell 42.

In the division setting step, in each cell 42, the division setting unit 10 converts, for each group in the cell, according to a set rotation angle θ, the x-y coordinate system into an x'-y' coordinate system by rotating the x-y coordinate system counterclockwise by the set rotation angle θ, and sets an x'-direction division number $ndiv_x$ and a y'-direction division number $ndiv_y$ of the quadrangular frame 40. Moreover, it sets each coordinate for division. When the division number $ndiv_x=m$, it sets x-direction coordinates $x_1$ to $x_m$ (x coordinate for division) obtained by converting an x' coordinate in the x'-y' coordinate system to an x coordinate in the x-y coordinate system. When the division number $ndiv_y=n$, it sets y-direction coordinates $y_1$ to $y_n$ (y coordinate for division) obtained by converting a y' coordinate in the x'-y' coordinate system to a y coordinate in the x-y coordinate system. When not dividing, the x-direction division number $ndiv_x$ and the y-direction division number $ndiv_y$ should be set to be zero. Alternatively, when not dividing, the division setting step may be omitted. The contents of the dividing method may be the same as those described with reference to FIGS. 4A to 4C, FIGS. 5A and 5B, and FIG. 6. In that case, the figure pattern should be read as the quadrangular frame 40.

The contents of the dose setting step are the same as those of the sixth embodiment (the second embodiment).

In the case of FIGS. 28A and 28B, similarly to FIG. 27, there are defined doses (or dose modulation amounts (rates)) for the positions of the four corner points of the quadrangular frame 40, intersections each between each side of the quadrangular frame 40 and a parting line which divides the quadrangular frame 40 into divisions arranged along the x-axis or the y-axis, and intersections each between the parting lines. The data format with a dose modulation amount shown in FIGS. 28A and 28B is the same as that of FIG. 27 except that the expression code ($code_{ROT}$) and the rotation angle θ which indicate rotation information are added.

In the writing data generation step, the writing data generation unit 14 generates pattern data (writing data), for each group in each cell, based on a data format that sequentially defines rotation information, being a part of figure information on figure patterns forming the group concerned, which indicates a rotation angle of the figure patterns, the figure information, being other than the rotation information, on the figure patterns forming the group concerned, and dose information which is defined before or after the figure information and indicates doses (or dose modulation amounts (rates)) for the positions of the four corner points of the quadrangular frame 40. Although, in the case of FIGS. 28A and 28B, the expression code ($code_{ROT}$) and the rotation angle θ, which show rotation information, are separated from the other figure information in a manner such that they are defined before the dose information, it is not limited thereto. It is also preferable to define the rotation information to be continuous with the other figure information and to be before or after the dose information. The generated pattern data (writing data) is output to the storage device 342 and stored therein.

As described above, according to the seventh embodiment, with respect to one quadrangular pattern (group: continuously connected figure patterns), 1-byte expression code ($code_{ROT}$) indicating being a rotation angle and 4-byte rotation angle θ of a figure pattern are added to the configuration of FIG. 27. Therefore, the data format for x-direction m-times division and y-direction n-times division shown in FIGS. 28A and 28B can be defined, with respect to one cell, by $1+1+4+1+2\times2+3\times2+2\times2+3\times(m+n)+2\times(m+2)(n+2)+N\cdot(1+3\times2+2\times2)+1=(30+2mn+7m+7n+11N)$ bytes.

In the dose calculation step according to the seventh embodiment, first, the dose calculation unit 113 obtains coordinates (x', y') by converting, by using a rotation angle θ, the coordinates of the position (x, y) for which a dose (or dose modulation amount (rate)) has been set into the x'-y' coordinate system which is obtained by rotating the x-y coordinate system counterclockwise by the rotation angle θ. Then, it calculates a dose (or dose modulation amount (rate)) d(x', y') for a desired position (x', y') by using dose information defined in the writing data. The calculation method for the dose (or dose modulation amount (rate)) d(x', y') is reading the coordinates (x, y) in the equation (1) as coordinates (x', y') and performing, for example, linear interpolation similar to that applied in the equation (1). Then, after the calculation, the coordinates (x', y') of d(x', y') should be converted to coordinates (x, y).

Although, in the example described above, the position for which a dose (or dose modulation amount (rate)) has been set is defined by the position (x, y) having been converted into the x-y coordinate system that is not rotated by the rotation angle θ, it is not limited thereto. It is also preferable to perform defining by using coordinates (x', y') in the x'-y' coordinate system obtained by rotating the x-y coordinate system counterclockwise by the rotation angle θ. In that case, calculation should be performed by reading the coordinates (x, y) in the equation (1) as coordinates (x', y') in the dose calculation step, and performing, for example, linear interpolation similar to that applied in the second embodiment. Then, after the calculation, the coordinates (x', y') of d(x', y') should be converted to coordinates (x, y).

As described above, according to the seventh embodiment, the same effect as that of the sixth embodiment can be acquired. Furthermore, it is possible to eliminate the necessity of defining dose information for each minute size even when the figure patterns (group) are rotated.

The embodiments have been explained referring to concrete examples described above. However, the present invention is not limited to these specific examples. Although the writing apparatus 100 of a multi-beam system has been described in the above examples, it is not limited thereto. The present invention can also be applied to writing data for the writing apparatus of a raster (Gaussian beam) method using a single beam.

While the apparatus configuration, control method, and the like not directly necessary for explaining the present invention are not described, some or all of them may be suitably selected and used when needed. For example, although description of the configuration of the control unit for controlling the writing apparatus 100 is omitted, it should be understood that some or all of the configuration of the control unit is to be selected and used appropriately when necessary.

In addition, any other method for generating writing data, writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for generating writing data to be input to a writing apparatus that writes a figure pattern on a target object by using a charged particle beam, the method comprising:
   storing figure information on a figure pattern in a storage device;
   reading the figure information on the figure pattern from the storage device to set one of a dose and a dose modulation rate for modulating a dose, for a position of each of corner points of the figure pattern using the figure information;
   defining the figure information as a part of a writing data;
   defining dose information which indicates the one of the dose and the dose modulation rate for modulating the dose, for the position of each of the corner points of the figure pattern, sequentially before or after the figure information as another part of the writing data, based on a data format that sequentially defines figure information on the figure pattern, and dose information which is defined before or after the figure information and indicates the one of the dose and the dose modulation rate for modulating the dose, for the position of each of the corner points of the figure pattern to output the writing data with the data format; and
   outputting the writing data including the figure information and the dose information to the writing apparatus and writing the figure pattern on the target object using the charged particle beam, wherein
   dose information for each position of the figure pattern is determined by interpolating the close information for each of the four corner points of the figure pattern.

2. The method according to claim 1, wherein the data format further defines rotation information indicating a rotation angle of the figure pattern.

3. A method for generating writing data to be input to a writing apparatus that writes at least one figure pattern on a target object by using a charged particle beam, the method comprising:
   storing figure information on at least one figure pattern in a storage device;
   inputting the figure information on the at least one figure pattern from the storage device, and setting a quadrangular frame which encloses the at least one figure pattern using the figure information;
   setting one of a dose and a dose modulation rate for modulating a dose, for a position of each of four corner points of the quadrangular frame;
   defining the figure information as a part of a writing data;
   defining dose information which indicates the one of the dose and the dose modulation rate for the position of the each of the four corner points of the quadrangular frame, sequentially before or after the figure information as another part of the writing data, based on a data format that sequentially defines the figure information on the at least one figure pattern, and the dose information which is defined before or after the figure information and indicates the one of the dose and the dose modulation rate for the position of the each of the four corner points of the quadrangular frame to output the writing data with the data format; and
   outputting the writing data including the figure information and the dose information to the writing apparatus and writing the figure pattern on the target object using the charged particle beam, wherein
   dose information for each position of the figure pattern is determined by interpolating the dose information from each of the four corner points of the quadrangular frame.

4. The method according to claim 3, wherein
   the figure information defines figure information on a plurality of figure patterns, further comprising:
   inputting the figure information on the plurality of figure patterns, and grouping the plurality of figure patterns into at least one group composed of continuous figure patterns, wherein in the setting the quadrangular frame, the quadrangular frame enclosing the continuous figure patterns of a group concerned is set for each of the at least one group, in the setting the one of the dose and the dose modulation rate, the one of the dose and the dose modulation rate for the position of the each of the four corner points of the quadrangular frame is set for the each of the at least one group, and the writing data is generated, for the each of the at least one group, based on a data format that sequentially defines the figure information on the continuous figure patterns in the group concerned, and the dose information which is defined before or after the figure information and is for the position of the each of the four corner points of the quadrangular frame.

5. The method according to claim 3, wherein the dose information further indicates the one of the dose and the dose modulation rate for each of intersections each between any one side of the quadrangular frame and a parting line which divides the quadrangular frame into divisions arranged along at least one of an x-axis and a y-axis.

6. The method according to claim 3 further comprising:
setting, after the quadrangular frame has been set, a rotation angle of the quadrangular frame.

7. The method according to claim 6, wherein the data format further defines rotation information indicating the rotation angle of the quadrangular frame.

8. The method according to claim 3, further comprising:
setting, after the quadrangular frame has been set, a cell region including a whole figure enclosed by the quadrangular frame, wherein
the data format further defines an offset amount from an origin of the cell region to an origin of the quadrangular frame.

9. The method according to claim 8, further comprising:
setting, after the cell region has been set, a rotation angle of the cell region, wherein
the data format further defines rotation information indicating the rotation angle of the cell region.

10. A method for generating writing data to be input to a writing apparatus that writes a figure pattern on a target object by using a charged particle beam, the method comprising:

storing figure information on at least one figure pattern in a storage device;

inputting the figure information on the figure pattern from the storage device, and setting a quadrangular frame which encloses a part of the figure pattern using the figure information;

setting a plurality of mesh regions, each having a fixed size, in a region including a remaining part of the figure pattern, wherein a size of the quadrangular frame is different from the fixed size of each mesh region;

setting one of a dose and a dose modulation rate for a position of each of four corner points of the quadrangular frame;

setting at least one of a dose and a dose modulation rate for modulating a dose, for each of the plurality of mesh regions;

defining the figure information on the figure pattern as a part of a writing data;

defining first dose information which indicates the one of the dose and the dose modulation rate having been set for the position of the each of the four corner points of the quadrangular frame, and second dose information which indicates the one of the dose and the dose modulation rate having been set for the each of the plurality of mesh regions each having the fixed size, sequentially before or after the figure information as another part of the writing data, based on a data format that sequentially defines the figure information on the figure pattern, the first dose information which is defined before or after the figure information and indicates the one of the dose and the dose modulation rate having been set for the position of the each of the four corner points of the quadrangular frame, and the second dose information which indicates the one of the dose and the dose modulation rate having been set for the each of the plurality of mesh regions each having the fixed size to output the writing data with the data format; and outputting the writing data including the figure information and the first and second dose information to the writing apparatus and writing the figure pattern on the target object using the charged particle beam, wherein dose information for positions of the figure pattern is determined by interpolating the first dose information from each of the four corner points of the quadrangular frame and by using the second dose information for one of the mesh regions.

* * * * *